United States Patent
Nagao et al.

(10) Patent No.: US 10,955,114 B2
(45) Date of Patent: *Mar. 23, 2021

(54) PHOSPHOR AND LIGHT-EMITTING APPARATUS

(71) Applicant: Panasonic Intellectual Property Management Co., Ltd., Osaka (JP)

(72) Inventors: Nobuaki Nagao, Gifu (JP); Mitsuru Nitta, Kyoto (JP); Yasuhisa Inada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 659 days.

This patent is subject to a terminal disclaimer.

(21) Appl. No.: 15/723,240

(22) Filed: Oct. 3, 2017

(65) Prior Publication Data

US 2018/0038575 A1 Feb. 8, 2018

Related U.S. Application Data

(63) Continuation of application No. PCT/JP2017/019464, filed on May 25, 2017, which is a continuation of application No. PCT/JP2017/000935, filed on Jan. 13, 2017.

(30) Foreign Application Priority Data

Jul. 4, 2016 (JP) ............... JP2016-132126
Feb. 16, 2017 (JP) ............... JP2017-026910

(51) Int. Cl.
| | |
|---|---|
| *F21V 9/30* | (2018.01) |
| *C09K 11/77* | (2006.01) |
| *H01S 5/00* | (2006.01) |
| *F21K 9/60* | (2016.01) |
| *H01L 33/50* | (2010.01) |
| *H01S 5/022* | (2006.01) |
| *F21Y 113/17* | (2016.01) |
| *F21Y 115/10* | (2016.01) |
| *H01S 5/02212* | (2021.01) |

(52) U.S. Cl.
CPC ............ *F21V 9/30* (2018.02); *C09K 11/7774* (2013.01); *F21K 9/60* (2016.08); *H01S 5/005* (2013.01); *F21Y 2113/17* (2016.08); *F21Y 2115/10* (2016.08); *H01L 33/50* (2013.01); *H01S 5/02212* (2013.01)

(58) Field of Classification Search
CPC .. C09K 11/7774; H01L 33/502; H01L 33/504
See application file for complete search history.

(56) References Cited

U.S. PATENT DOCUMENTS

| | | |
|---|---|---|
| 4,507,585 A | 3/1985 | Inoue et al. |
| 4,809,291 A | 2/1989 | Byer et al. |
| 5,202,891 A | 4/1993 | Sleight et al. |
| 5,246,804 A | 9/1993 | Furukawa et al. |
| 6,228,286 B1 | 5/2001 | Leblans et al. |
| 6,569,156 B1 | 5/2003 | Tankovich et al. |
| 7,094,362 B2 | 8/2006 | Setlur et al. |
| 8,337,400 B2 | 12/2012 | Mizuyoshi |
| 8,491,816 B2 | 7/2013 | Hong et al. |
| 8,790,253 B2 | 7/2014 | Sunagawa et al. |
| 8,858,429 B2 | 10/2014 | Mizuyoshi et al. |
| 9,062,253 B2 * | 6/2015 | Won ................ C09K 11/7792 |
| 9,526,408 B2 | 12/2016 | Yamaguchi et al. |
| 9,725,648 B2 | 8/2017 | Izawa et al. |
| 10,026,876 B2 * | 7/2018 | Hosokawa ............ H01L 33/504 |
| 10,411,170 B2 | 9/2019 | Tragl et al. |
| 2004/0145308 A1 | 7/2004 | Rossner et al. |
| 2005/0117334 A1 | 6/2005 | Lee et al. |
| 2005/0242329 A1 | 11/2005 | Fiedler et al. |
| 2006/0043879 A1 | 3/2006 | Naitou |
| 2006/0197098 A1 | 9/2006 | Aihara |
| 2007/0126011 A1 | 6/2007 | Lee |
| 2007/0159066 A1 | 7/2007 | Cheetham et al. |
| 2007/0263678 A1 | 11/2007 | Mizuuchi et al. |
| 2008/0150412 A1 | 6/2008 | Yoshimatsu |
| 2008/0262316 A1 | 10/2008 | Ajima et al. |
| 2009/0066230 A1 | 3/2009 | Hirosaki et al. |
| 2009/0167149 A1 | 7/2009 | Ito |

(Continued)

FOREIGN PATENT DOCUMENTS

| | | |
|---|---|---|
| CN | 101220272 A | 7/2008 |
| CN | 102361956 A | 2/2012 |
| CN | 102543986 A | 7/2012 |
| CN | 103148395 A | 6/2013 |
| CN | 103254900 A | 8/2013 |
| CN | 103715342 A | 4/2014 |
| EP | 2610217 A1 | 7/2013 |
| JP | 2006-008721 | 1/2006 |
| JP | 2007-231245 A | 9/2007 |
| JP | 2008-088362 | 4/2008 |
| JP | 2008-177484 A | 7/2008 |
| JP | 2008-285659 A | 11/2008 |
| JP | 2009-189473 A | 8/2009 |

(Continued)

OTHER PUBLICATIONS

International Search Report of PCT application No. PCT/JP2017/019465 dated Aug. 22, 2017.

(Continued)

*Primary Examiner* — C Melissa Koslow

(74) *Attorney, Agent, or Firm* — McDermott Will and Emery LLP

(57) ABSTRACT

The phosphor according to an aspect of the present disclosure contains a crystal phase having a chemical composition $Ce_xY_yLa_{3-x-y}Si_6N_{11}$, where x and y satisfy $0<x\leq0.6$, and $(1.5-x)\leq y\leq(3-x)$. The phosphor has an emission spectral peak within a wavelength range of 600 nm or more and 660 nm or less and a first excitation spectral peak within a wavelength range of 480 nm or more and 550 nm or less.

15 Claims, 14 Drawing Sheets

(56) References Cited

U.S. PATENT DOCUMENTS

| | | |
|---|---|---|
| 2009/0312607 A1 | 12/2009 | Sunagawa et al. |
| 2010/0085728 A1 | 4/2010 | Seto et al. |
| 2011/0198651 A1 | 8/2011 | Chen et al. |
| 2012/0242912 A1 | 9/2012 | Kitano |
| 2012/0256533 A1 | 10/2012 | Seto et al. |
| 2012/0300178 A1 | 11/2012 | Sugiyama et al. |
| 2012/0302847 A1 | 11/2012 | Ozawa et al. |
| 2013/0234588 A1 | 9/2013 | Seto et al. |
| 2014/0131748 A1 | 5/2014 | Song |
| 2014/0185282 A1 | 7/2014 | Hsu et al. |
| 2014/0264402 A1 | 9/2014 | Mei et al. |
| 2014/0285772 A1 | 9/2014 | Tajiri |
| 2016/0150200 A1 | 5/2016 | Saka et al. |
| 2016/0276549 A1 | 9/2016 | Yamashita et al. |
| 2016/0330806 A1 | 11/2016 | Yamashita et al. |
| 2017/0263592 A1 | 9/2017 | Schmidt et al. |
| 2017/0307163 A1 | 10/2017 | Nagasaki et al. |
| 2017/0331012 A1 | 11/2017 | Heidemann et al. |
| 2017/0343188 A1 | 11/2017 | Oshio et al. |
| 2018/0346808 A1 | 12/2018 | Nitta et al. |
| 2019/0171093 A1 | 6/2019 | Furuyama et al. |
| 2019/0177614 A1 | 6/2019 | Nagao et al. |

FOREIGN PATENT DOCUMENTS

| | | |
|---|---|---|
| JP | 2009-249445 A | 10/2009 |
| JP | 4729480 B2 | 7/2011 |
| JP | 2010-114040 A | 6/2012 |
| JP | 2014-224230 A | 12/2014 |
| JP | 2016-028124 A | 2/2016 |
| JP | 2016-104232 A | 6/2016 |
| WO | 2007/041563 A2 | 4/2007 |
| WO | 2009/157999 A1 | 12/2009 |
| WO | 2015/025570 A1 | 2/2015 |
| WO | 2016/092743 A1 | 6/2016 |

OTHER PUBLICATIONS

International Search Report of PCT application No. PCT/JP2017/019466 dated Aug. 22, 2017.
International Search Report of PCT application No. PCT/JP2017/019467 dated Aug. 22, 2017.
Yun-Chen Wu et al., "a-(Y,Gd)FS:Ce3+: a novel red-emitting fluorosulfide phosphor for solid-state lighting", Journal of Materials Chemistry, 21, Oct. 21, 2011, pp. 15163-15166.
The Extended European Search Report dated Jun. 27, 2019 for the related European Patent Application No. 17823889.5.
The Extended European Search Report dated Jun. 28, 2019 for the related European Patent Application No. 17823890.3.
The Extended European Search Report dated Jun. 28, 2019 for the related European Patent Application No. 17823891.1.
The Extended European Search Report dated Jul. 2, 2019 for the related European Patent Application No. 17780614.8.
The Extended European Search Report dated Jun. 27, 2019 for the related European Patent Application No. 17734219.3.
Lihong Liu et al: "Yellow-Emitting Y3Si6N11: Ce3+ Phosphors for White Light-Emitting Diodes (LEDs)", Journal of the American Ceramic Society., vol. 96, No. 6, Jun. 1, 2013 (Jun. 1, 2013), pp. 1688-1690,XP055450326.
Database WPI Week 201372 Thomson Scientific, London, GB; AN 2013-R71607, XP002792144.
International Search Report of PCT application No. PCT/JP2017/019464 dated Jun. 27, 2017.
International Search Report of PCT application No. PCT/JP2017/000935 dated Mar. 7, 2017.
Yongchao Jia et al., "First-principles study of Ce3+-doped lanthanum silicate nitride phosphors: Neutral excitation, Stokes shift, and luminescent center identification", Physical Review B93,155111, Apr. 6, 2016.
R. Le Toquin et al., "Red-emitting cerium-based phosphor materials for solid-state lighting applications", Chemical Physics Letters, vol. 423, ISSUES4-6, Jun. 1, 2006, pp. 352-356.
Diang-Qiang Zhu et al., "Extra-Broad Band Orange-Emitting Ce3+-Doped Y3Si5N9O Phosphor for Solid-State Lighting: Electronic, Crystal Structures and Luminescence Properties", Chemistry of Materials, vol. 28, Jun. 20, 2016, pp. 4829-4839.
Notice of Allowance issued in U.S. Appl. No. 15/636,747, dated Oct. 17, 2018.
Non-Final Office Action issued in U.S. Appl. No. 15/933,606, dated Jun. 17, 2020.
English Translation of Chinese Search Report dated May 8, 2020 for the related Chinese Patent Application No. 201780002095.2.
English Translation of Chinese Search Report dated May 8, 2020 for the related Chinese Patent Application No. 201780002084.4.
Non-Final Office Action issued in U.S. Appl. No. 15/933,455, dated Sep. 5, 2019.
Notice of Allowance issued in U.S. Appl. No. 15/933,455, dated Mar. 10, 2020.
Non-Final Office Action issued in U.S. Appl. No. 15/933,624, dated Jul. 9, 2020.
Non-Final Office Action issued in U.S. Appl. No. 16/245,101, dated Oct. 31, 2019.
Notice of Allowance issued in U.S. Appl. No. 16/245,101, dated Mar. 13, 2020.
English Translation of Chinese Search Report dated Jan. 6, 2021 for the related Chinese Patent Application No. 201780002085.9.
English Translation of Chinese Search Report dated Jan. 27, 2021 for the related Chinese Patent Application No. 201780002095.2.
English Translation of Chinese Search Report dated Jan. 27, 2021 for the related Chinese Patent Application No. 201780002084.4.

\* cited by examiner

SAMPLE No. 1

SAMPLE No. 2

SAMPLE No. 3

SAMPLE No. 4

SAMPLE No. 5

SAMPLE No. 6

SAMPLE No. 7

SAMPLE No. 8

SAMPLE No. 9

SAMPLE No. 10

PHOSPHOR AND LIGHT-EMITTING APPARATUS

BACKGROUND

1. Technical Field

The present disclosure relates to a phosphor and a light-emitting apparatus.

2. Description of the Related Art

In recent years, solid state light sources, such as white light emitting diodes (LEDs) and laser excitation light sources, are becoming widely used. A current typical white LED has a structure composed of a combination of a blue light emitting element (blue LED chip) and a phosphor. In such a typical white LED, the phosphor converts the color of part of the light from the blue LED chip, and the blue light from the blue LED chip and the light emitted by the phosphor are mixed into white light. More recently, a laser diode (LD) and a phosphor are combined to develop a high-output white light-emitting apparatus. Although a combination of a blue LED chip or blue LD and a yellow phosphor is mainly used as the current solid state white-light source, a white light source including a red phosphor in addition to a blue light source and a yellow phosphor is being developed for enhancing, for example, color rendering properties and color reproducibility or for forming white light with low color temperature.

Yellow phosphors containing Ce as the emission centers, such as the phosphors represented by the formula $Y_3Al_5O_{12}$:$Ce^{3+}$ (hereinafter, abbreviated as YAG:Ce) and the formula $La_3Si_6N_{11}$:$Ce^{3+}$ (hereinafter, abbreviated as LSN:Ce) described in Japanese Patent No. 4459941, have been known. Red phosphors containing Eu as the emission centers, such as the formula (Sr,Ca)AlSiN$_3$:$Eu^{2+}$ (hereinafter, abbreviated as CASN:Eu) described in Japanese Patent No. 3837588, have been also known.

SUMMARY

One non-limiting and exemplary embodiment provides a phosphor containing Ce as the emission center.

Solution to Problem

In one general aspect, the techniques disclosed here feature a phosphor containing a crystal phase having a chemical composition $Ce_xY_yLa_{3-x-y}Si_6N_{11}$, where x and y satisfy $0<x\leq0.6$, and $(1.5-x)\leq y\leq(3-x)$, and having an emission spectral peak within a wavelength range of 600 nm or more and 660 nm or less and a first excitation spectral peak within a wavelength range of 480 nm or more and 550 nm or less.

The present disclosure can provide a phosphor containing Ce as the emission center.

The generic or specific aspect of the present disclosure may be achieved as a phosphor, an element, an apparatus, a system, a vehicle, a method, or any combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
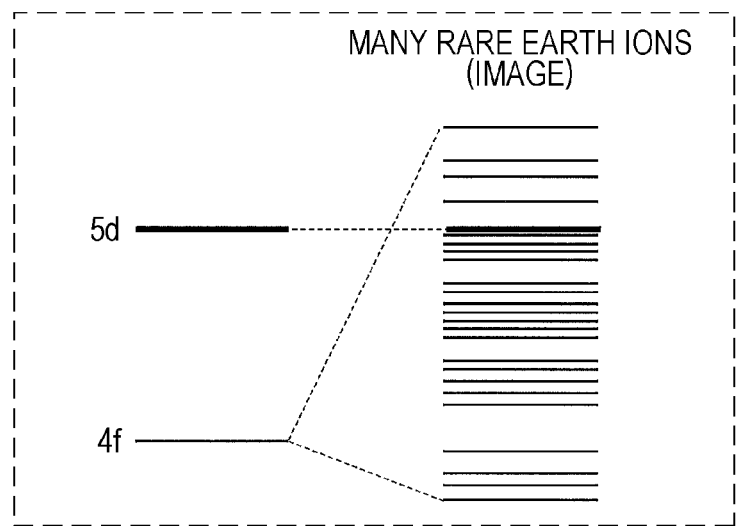
FIG. 1A is a conceptual diagram illustrating splitting of the 4f orbital and the 5d orbital of a rare earth ion.

Knowledge Forming the Basis of the Present Disclosure

Apparatuses of the following systems can be considered as white light-emitting apparatuses using LEDs.

A first system is a pseudo-white light source composed of a combination of a blue LED and a yellow phosphor YAG:Ce. A light-emitting apparatus of this system can reduce the power consumption and easily control the drive of the LED and is therefore widely used. However, since this white light source uses only two color components, warm light, such as light bulb color light, cannot be projected and color control is difficult.

A second system is a white light source composed of a combination of a blue LED, a yellow phosphor YAG:Ce, and a red phosphor CASN:Eu. In a light-emitting apparatus of this system, white light is a mixed color of three color components, and appropriate white light can be projected by adjusting the light intensities of the individual color components. Accordingly, the light-emitting apparatus of this system can easily control the color compared to the light-emitting apparatus of the system using two color components. The yellow phosphor YAG:Ce used in this light-emitting apparatus has high light emission quantum efficiency and does hardly change the light emission quantum efficiency even if it is excited by a high-output LED or LD. In contrast, the red phosphor CASN:Eu has a problem of decreasing the light emission quantum efficiency when excited by high-output light and is mounted on only light sources of relatively low outputs. This is because, since a phosphor containing Eu as the emission center has a long emission lifetime compared to a phosphor containing Ce as the emission center, the brightness is easily saturated under high-output excitation. Accordingly, a white light source having a high output and capable of easily controlling the color has not been achieved.

Accordingly, the present inventors have diligently studied in order to obtain a red phosphor containing Ce as the emission center for achieving a light-emitting apparatus that can radiate light at high output and radiate white light of which the color is easily controlled.

Summary of Aspects According to the Present Disclosure

The phosphor according to a first aspect of the present disclosure contains a crystal phase having a chemical composition $Ce_xY_yLa_{3-x-y}Si_6N_{11}$, where x and y satisfy $0<x\leq0.6$, and $(1.5-x)\leq y\leq(3-x)$. The phosphor has an emission spectral peak within a wavelength range of 600 nm or more and 660 nm or less and a first excitation spectral peak within a wavelength range of 480 nm or more and 550 nm or less.

According to the first aspect of the present disclosure, a phosphor containing Ce as the emission center can be achieved.

In a second aspect, for example, x and y defining the phosphor according to the first aspect may satisfy $(1.5-0.5x) \leq y\leq(3-x)$.

The phosphor according to the second aspect can increase the emission wavelength and the excitation wavelength.

In a third aspect, for example, x and y defining the phosphor according to the second aspect may satisfy $1.5\leq y\leq(3-x)$.

The phosphor according to the third aspect can further increase the emission wavelength and the excitation wavelength.

In a fourth aspect, for example, the crystal phase of the phosphor according to at least any one of the first to third aspects may have a tetragonal crystal structure.

In a fifth aspect, for example, the phosphor according to at least any one of the first to fourth aspects may have a second excitation spectral peak within a wavelength range of 350 nm or more and less than 480 nm.

The phosphor according to the fifth aspect can emit light even if excited by light having a shorter wavelength, such as excitation light of 450 nm from a blue LED or 405 nm from a violet LD, and can select an excitation light source from a large number of alternatives.

In a sixth aspect, for example, the crystal phase of the phosphor according to at least any one of the first to fifth aspects may have a 1/e emission lifetime of 100 ns or less.

The phosphor according to the sixth aspect has excellent brightness saturation characteristics and is therefore promising as a red phosphor having high quantum efficiency even under high output.

In a seventh aspect, for example, the crystal phase of the phosphor according to at least any one of the first to sixth aspects may have a crystal structure where at least part of the La(2a)-sites in the crystal structure of $La_3Si_6N_{11}$ are substituted by Ce.

The phosphor according to the seventh aspect can emit light with excitation light having a longer wavelength and is therefore suitable for, for example, a combination with a green excitation light source.

In an eighth aspect, for example, the crystal phase of the phosphor according to at least any one of the first to seventh aspects may have a crystal structure where at least part of the La(4c)-sites in the crystal structure of $La_3Si_6N_{11}$ are substituted by Y.

In the phosphor according to the eighth aspect, Y substitutes for at least part of the La(4c)-sites in the crystal structure of $La_3Si_6N_{11}$ to decrease the lattice constants of the a-axis and the b-axis of the crystal lattice, leading to a relative extension of the c-axis. Consequently, the lattice distortion increases, resulting in a decrease in the energy difference between the 4f and 5d orbitals to increase the emission wavelength.

In a ninth aspect, for example, the crystal phase of the phosphor according to the eighth aspect may have a crystal structure where more than a half of the La(4c)-sites in the crystal structure of $La_3Si_6N_{11}$ are substituted by Y.

In the phosphor according to the ninth aspect, a large crystal distortion occurs. As a result, the wavelength is largely shifted to the longer side to enable red light emission.

The light-emitting apparatus according to a tenth aspect of the present disclosure comprises an excitation light source that emits light having a wavelength of 600 nm or less and a first phosphor that is the phosphor according to at least any one of the first to ninth aspects. The first phosphor is disposed at a location where the first phosphor is irradiated with the light emitted by the excitation light source and emits fluorescence having a wavelength longer than the wavelength of the light from the excitation light source.

The light-emitting apparatus according to the tenth aspect includes the phosphor according to at least any one of the first to ninth aspects and therefore can exhibit higher quantum efficiency even under high output compared to existing light-emitting apparatuses. Furthermore, when the light-emitting apparatus according to the tenth aspect is constructed into a white light-emitting apparatus, high color rendering properties and color reproducibility can be achieved.

In an eleventh aspect, for example, the wavelength of the light emitted by the excitation light source of the light-emitting apparatus according to the tenth aspect may be within a wavelength range of 480 nm or more and 600 nm or less.

The light-emitting apparatus according to the eleventh aspect can efficiently excite a phosphor.

In an twelfth aspect, for example, the wavelength of the light emitted by the excitation light source of the light-emitting apparatus according to the tenth aspect may be within a wavelength range of 420 nm or more and 480 nm or less.

The light-emitting apparatus according to the twelfth aspect can use a GaN-based blue LED or blue LD as the excitation light source.

In a thirteenth aspect, for example, the excitation light source of the light-emitting apparatus according to at least any one of the tenth to twelfth aspects may be an LED or an LD.

According to the thirteenth aspect, a high-output light-emitting apparatus can be achieved.

In a fourteenth aspect, for example, the light-emitting apparatus according to at least any one of the tenth to thirteenth aspects may further include a second phosphor that is disposed at a location where the second phosphor is irradiated with the light emitted by the excitation light source, so as to emit fluorescence having a wavelength longer than the wavelength of the light from the excitation light source. The second phosphor has an emission spectral peak within a wavelength range of 480 nm or more and less than 600 nm.

The light-emitting apparatus according to the fourteenth aspect includes at least two phosphors having emission wavelengths different from each other and can thereby control the emission color.

In a fifteenth aspect, for example, the light-emitting apparatus according to the fourteenth aspect may further include a third phosphor that is disposed at a location where the third phosphor is irradiated with the light emitted by the excitation light source, so as to emit fluorescence having a wavelength longer than the wavelength of the light from the excitation light source, wherein the second phosphor may emit yellow light, and the third phosphor may emit green light.

The light-emitting apparatus according to the fifteenth aspect includes at least two phosphors: a phosphor emitting yellow light and a phosphor emitting green light, and can control the emission color.

EMBODIMENTS OF THE PRESENT DISCLOSURE

Embodiments of the present disclosure will now be described in detail. It should be understood that the present disclosure is not limited to these Embodiments and can be implemented with appropriate modifications within a scope not departing from the technical scope of the present disclosure.

Embodiment 1

In Embodiment 1, an embodiment of a phosphor of the present disclosure will be described. The embodiment of the phosphor of the present disclosure and also the circumstances under which the present inventors have arrived at the phosphor of the present disclosure will now be described.
Emission Principle of Rare Earth Phosphor The circumstances under which the present inventors have considered on the emission principle of rare earth phosphors and focused on $Ce^{3+}$ phosphors will now be described.

Among rare earth elements, Ce, Pr, Nd, Pm, Sm, Eu, Gd, Tb, Dy, Ho, Er, Tm, and Yb have 4f orbital valence electrons in a di- or tri-valent ion state. Most of these rare earth ions have a plurality of 4f orbital electrons, and, as conceptionally shown in FIG. 1A, the 4f orbital degeneracy is lost to largely split the orbital. Consequently, light emission can be achieved by using the transition from a 4f level to another 4f level (f-f transition). The f-f transition is forbidden transition and is therefore characterized by a long excited state lifetime of the electron. Accordingly, phosphors containing rare earth ions are widely used as laser media. However, when such a phosphor is used as an incoherent light source, such as general lighting, the light emission intensity is immediately saturated.

Figure 1B:
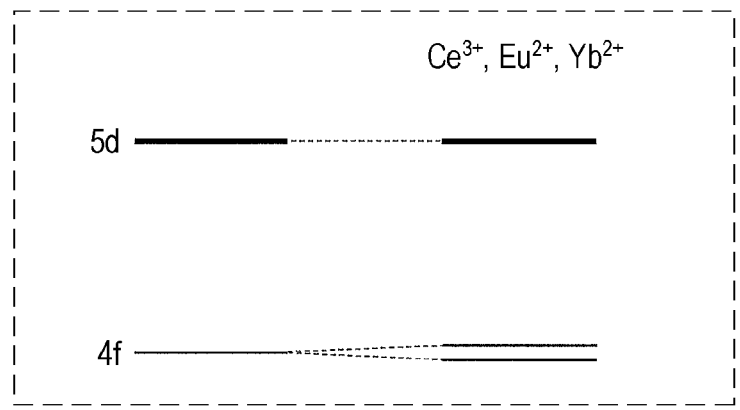
FIG. 1B is a conceptual diagram illustrating splitting of the 4f orbital and the 5d orbital of $Ce^{3+}$, $Eu^{2+}$, and $Yb^{2+}$.

Incidentally, $Ce^{3+}$ has only one 4f orbital valence electron. Consequently, as conceptionally shown in FIG. 1B, the split of the 4f orbital of $Ce^{3+}$ is significantly small compared to other rare earth ions. Exceptionally, $Eu^{2+}$ and $Yb^{2+}$ also have small energy splittings of the 4f orbital. This is because $Eu^{2+}$ has seven electrons in the 4f orbital being a half-closed shell and $Yb^{2+}$ has 14 electrons in the 4f orbital being a closed shell.

In $Ce^{3+}$, $Eu^{2+}$, and $Yb^{2+}$, the splitting of the 4f orbital is small, and the energy difference between the 4f ground level and the 5d orbital is large. In addition, the 4f orbital between the 4f ground level and the 5d orbital does not have large energy. Accordingly, the transition between the 4f and the 5d (4f-5d transition) can be easily used.

The 4f-5d transition is allowed transition, and the excited state lifetime of the electron is short. Therefore, light is emitted immediately after excitation, and saturation (brightness saturation) hardly occurs even if excited by strong excitation light.

Among $Ce^{3+}$, $Eu^{2+}$, and $Yb^{2+}$, the present inventors further focused on $Ce^{3+}$. In $Ce^{3+}$, only one electron is involved in the 4f-5d transition, and when the 5d excited state falls to the 4f ground state, the 4f orbital is completely vacant, i.e., the state density of the 4f orbital being involved in the transition is large. Accordingly, the present inventors have conceived that $Ce^{3+}$ has a shortest emission lifetime. In contrast, in $Eu^{2+}$, even if an electron is excited to the 5d orbital, six electrons still remain in the 4f orbital, and in $Yb^{2+}$, even if an electron is excited to the 5d orbital, 13 electrons still remain in the 4f orbital. Consequently, it is conceived that in $Eu^{2+}$ and $Yb^{2+}$, the state density of the 4f orbital is small and the emission lifetime is longer than that of $Ce^{3+}$. Therefore, the $Ce^{3+}$ phosphor probably has the shortest emission lifetime among rare earth elements and hardly causes brightness saturation. Actually, YAG:Ce has a 1/e emission lifetime of about 70 ns, whereas CASN:Eu has a 1/e emission lifetime of about 600 to 800 ns.

Based on this view, it can be said that $Ce^{3+}$ phosphors are superior to $Eu^{2+}$ phosphors. Actually, YAG:Ce is used in almost all of commercially available white LEDs. However, as a red phosphor, CASN:Eu is widely used. The reasons for this are probably that a $Ce^{3+}$ phosphor emitting red light is difficult to be achieved and a promising material is not still found. The reason and also the principle for determining the emission wavelength will now be described.
Emission Wavelength of Phosphor A phosphor containing $Ce^{3+}$ as the emission center and a phosphor containing $Eu^{2+}$ as the emission center utilize the transition from the 4f orbital ground state to the 5d orbital excited state (4f-5d transition). Each of $Ce^{3+}$ and $Eu^{2+}$ introduced into a crystal serving as the base of a phosphor is influenced by the mainly binding nearest neighbor anion atom (ligand) to change the 4f and 5d orbital energies, resulting in a change in the emission wavelength. That is, the emission wavelength of a phosphor is determined depending on the host crystal.

Figure 2:
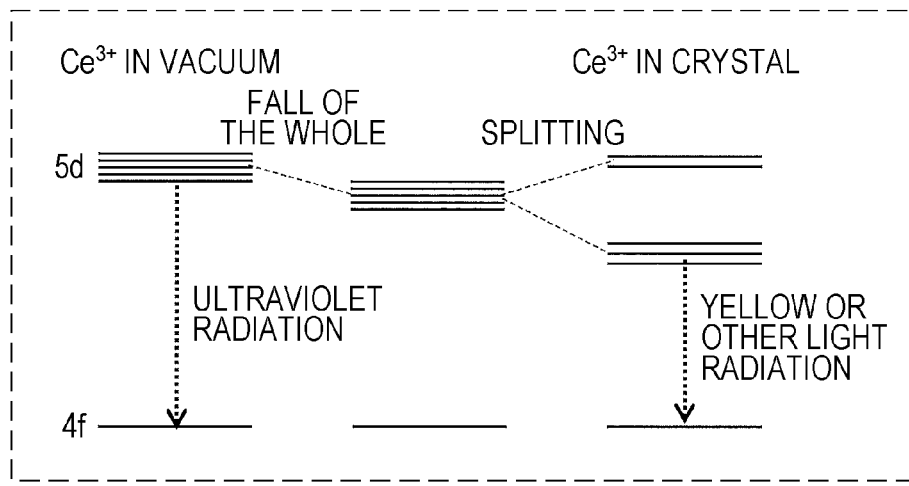
FIG. 2 is an energy level diagram of $Ce^{3+}$ in vacuum and in a crystal.

The ligand influences such that the 4f or 5d orbital energy shifts and that the degeneracy of the five 5d orbital levels is lost (that is, the 5d orbital splits). The former energy shift is highly influenced by the spreading of the wave function of the 4f or 5d orbital and the positional relation of the ligand. In the latter splitting of the 5d orbital, as shown in FIG. 2, the 5d orbital splits while maintaining the total energy of the five levels. Accordingly, an increase in the energy of any level decreases the energy of another level. Therefore, the minimum energy of the 5d orbital can be reduced by increasing the splitting of the 5d orbital.

The light emission due to 4f-5d transition occurs, as shown in FIG. 2, when the energy level falls from the minimum energy level of the 5d orbital to the 4f. Accordingly, introduction of $Ce^{3+}$ or $Eu^{2+}$ into a crystal can decrease the energy difference between the 4f and the 5d to increase the emission wavelength.

$Ce^{3+}$ in vacuum (i.e., a state of unintroduced to a crystal) has a large energy difference between the 4f and the 5d and emits light in the deep ultraviolet region, whereas $Eu^{2+}$ emits blue light. That is, $Eu^{2+}$ can achieve red light emission with a smaller amount of wavelength shift to the longer side, and actually, CASN:Eu has been practically used. In contrast, the $Ce^{3+}$ phosphor emitting light of the longest wavelength in practical use is a yellow phosphor YAG:Ce, and no red phosphor has been achieved.

Investigation by the Present Inventors

Figure 3:
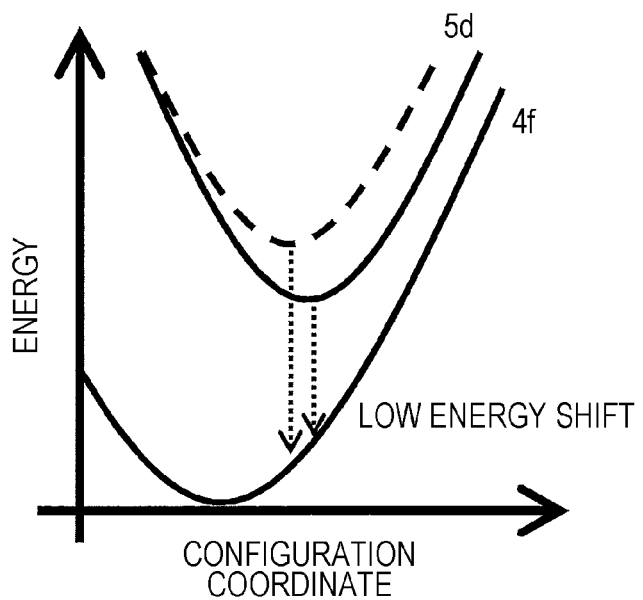
FIG. 3 is a model diagram of the configuration coordinate between the 4f orbital and the 5d orbital.

The present inventors inferred that a shift of the 5d orbital or the 4f orbital as shown in FIG. 3 is necessary for achieving a red phosphor containing Ce and advanced the study.

The inventors inferred that In order to further shift the 5d orbital or the 4f orbital, it is important that the ligand of $Ce^{3+}$ satisfies (1) a short ligand distance and (2) low ligand symmetry.

Regarding the requirement (1), if the ligand distance from $Ce^{3+}$ to the nearest neighbor anion is short, either the 4f orbital or the 5d orbital or both are further highly affected by the orbital of the anion, leading to a large energy shift. On this occasion, the energy of the 4f orbital is increased, or the splitting of the 5d orbital is increased to reduce the lowest energy level of the 5d orbital. This effect decreases the energy difference between the 4f and the 5d. Regarding the requirement (2), low ligand symmetry further stabilizes the 5d orbital having a wave function largely spreading in the direction in which no ligand exists. As a result, the energy difference between the 4f and the 5d is reduced.

The present inventors searched novel materials based on these objects. Specifically, calculation of emission wavelengths by crystal structure simulation was investigated. Through these efforts, the inventors arrived at a plurality of novel red phosphors showing red colors. The efforts will now be described.

Calculation of Emission Wavelength of Ce Phosphor

In order to reveal the relationship between the emission wavelength and the excitation wavelength of a phosphor containing Ce as the emission center, the present inventors simulated the emission wavelengths and the excitation wavelengths of a variety of crystals doped with Ce. The results of the crystal structure simulation and the conclusion thereof will now be described.

The present inventors calculated the emission wavelengths by the procedure described in the document "Y Jia, et al., PHYSICAL REVIEW B 93, 155111 (2016)". In this procedure, the excitation wavelength is calculated from the difference between the total energy at the equilibrium point of a ground state and the total energy in the excited state of the atomic coordinate. In this procedure, the emission wavelength is calculated from the difference between the total energy at the equilibrium point where the excited state is relaxed and the total energy in the ground state of the atomic coordinate. As a result, it is confirmed according to the document that the calculated emission wavelengths and excitation wavelengths of three phosphors, YAG:Ce, $LaSi_3N_5$:Ce, and $La_3Si_6N_{11}$:Ce, almost agree with experimental values. This time, the present inventors calculated the emission wavelength and excitation wavelength of $YAlO_3$:Ce, in addition to those of $LaSi_3N_5$:Ce and $La_3Si_6N_{11}$:Ce, and it was confirmed that the experimental results can be reproduced with high accuracy as in the above-mentioned document. Table 1 shows the excitation wavelength and the emission wavelength of each phosphor determined by simulation.

[Table 1]

TABLE 1

| Chemical composition | $(Y, Ce)AlO_3$ | $(La, Ce)Si_3N_5$ | $(La_3, Ce)Si_6N_{11}$ |
|---|---|---|---|
| Excitation wavelength (nm) | 310 | 366 | 470 |
| Emission wavelength (nm) | 349 | 445 | 543 |

Novel composition system $(La,Y)_3Si_6N_{11}$:Ce Phosphor

The present inventors tried to decrease the ligand distance by substituting the $La^{3+}$-sites of $La_3Si_6N_{11}$:Ce by $Y^{3+}$.

Since $Y^{3+}$ has a smaller ion radius compared to $La^{3+}$, substitution of the $La^{3+}$-sites has a possibility of reducing the lattice constant. It is expected that the ligand distance can be reduced with a decrease in the lattice constant.

Figure 4:
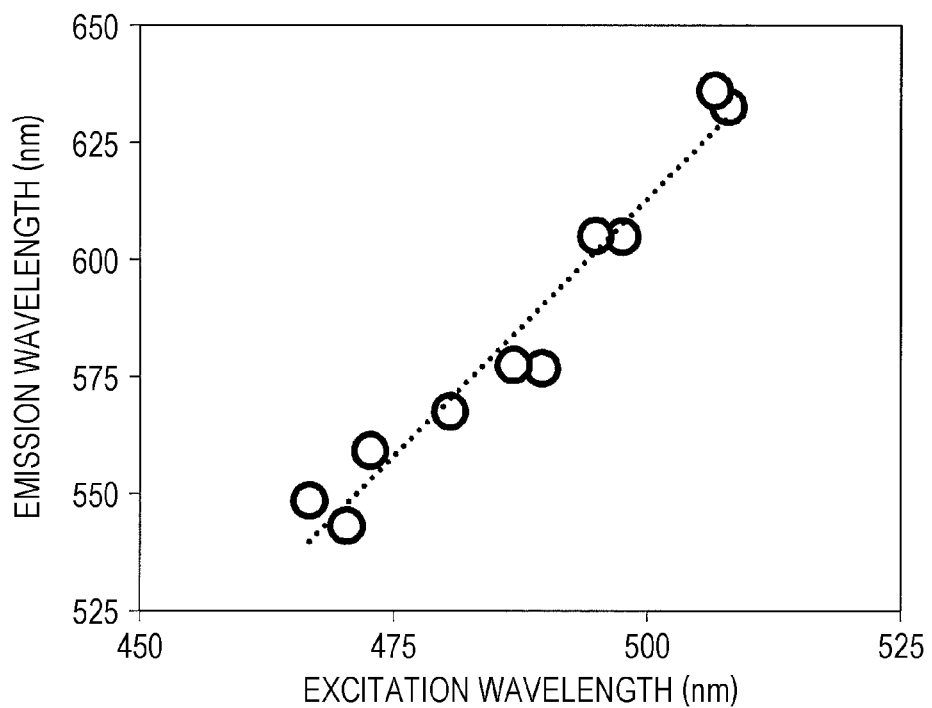
FIG. 4 is a graph showing a relationship between excitation wavelength and emission wavelength in $(La,Y)_3Si_6N_{11}$:Ce phosphor.
Figure 5:
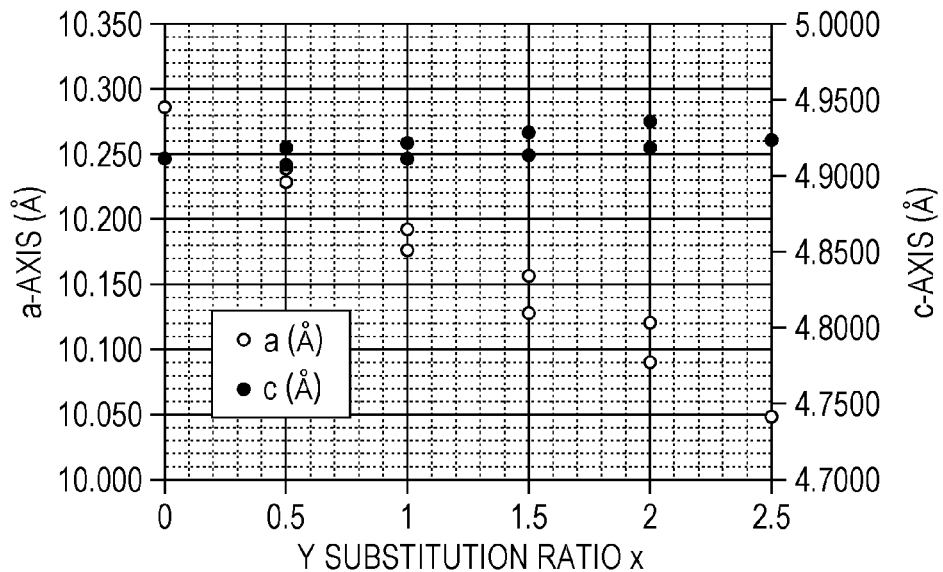
FIG. 5 is a graph showing a relationship between the substitution amount x of $Y^{3+}$ and the lattice constant of a-axis and a relationship between the substitution amount x of $Y^{3+}$ and the lattice constant of c-axis in $(La,Y)_3Si_6N_{11}$:Ce phosphor.
Figure 6:
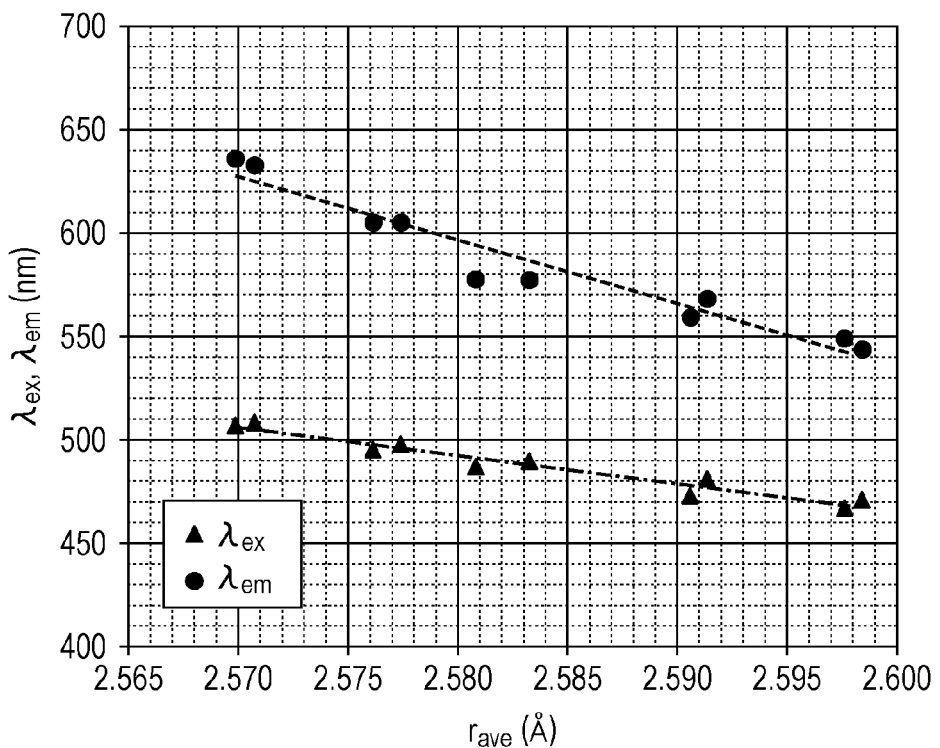
FIG. 6 is a graph showing a relationship between the average coordination distance $r_{ave}$ and the excitation wavelength $\lambda_{ex}$ and a relationship between the average coordination distance $r_{ave}$ and the emission wavelength $\lambda_{em}$ in $(La,Y)_3Si_6N_{11}$:Ce phosphor.
Figure 7:
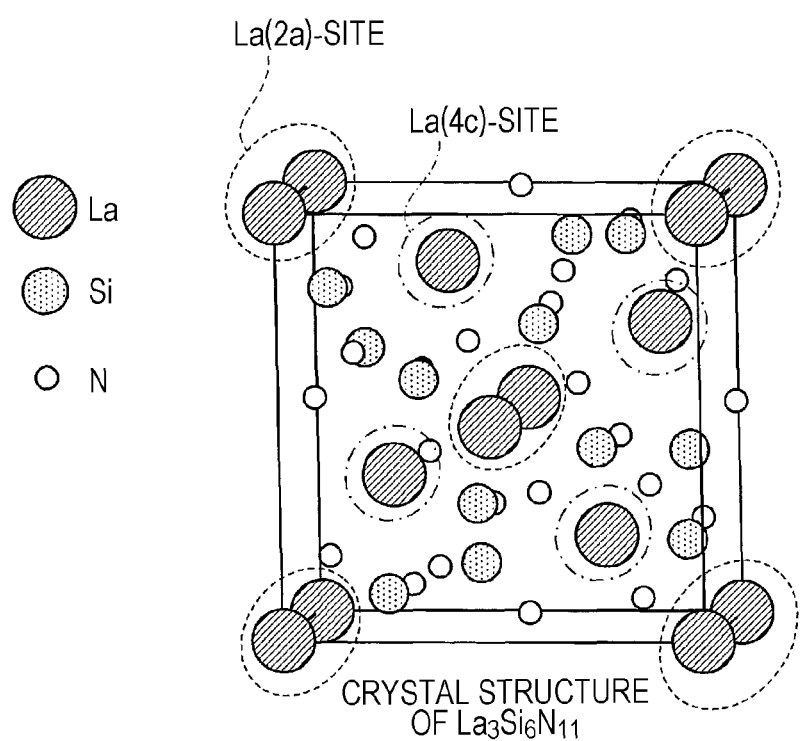
FIG. 7 is a diagram illustrating the crystal structure of $La_3Si_6N_{11}$ and two different sites of La.
Figure 8A:
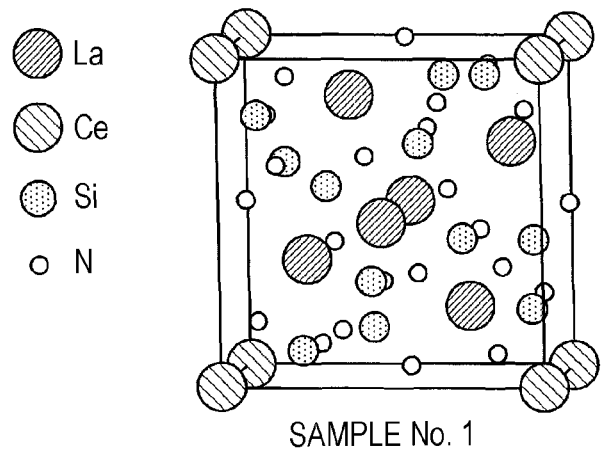
FIG. 8A is a diagram illustrating the crystal structure of $(La,Y)_3Si_6N_{11}$:Ce phosphor Sample No. 1.
Figure 8B:
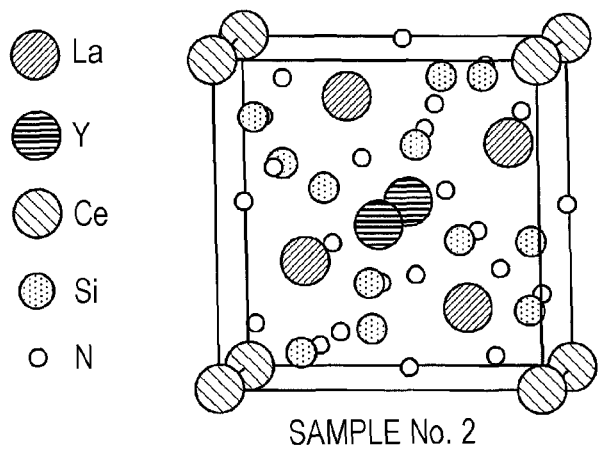
FIG. 8B is a diagram illustrating the crystal structure of $(La,Y)_3Si_6N_{11}$:Ce phosphor Sample No. 2.
Figure 8C:
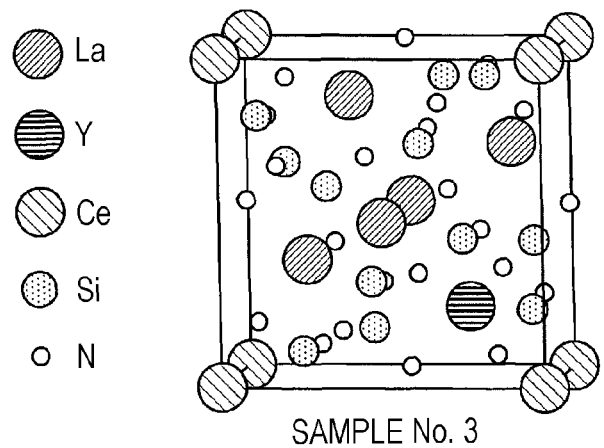
FIG. 8C is a diagram illustrating the crystal structure of $(La,Y)_3Si_6N_{11}$:Ce phosphor Sample No. 3.
Figure 8D:
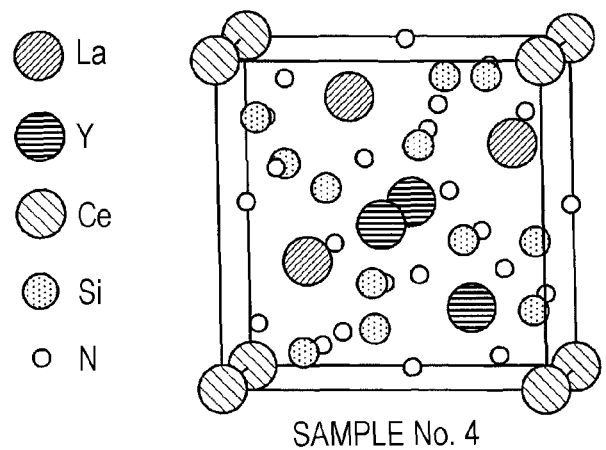
FIG. 8D is a diagram illustrating the crystal structure of $(La,Y)_3Si_6N_{11}$:Ce phosphor Sample No. 4.
Figure 8E:
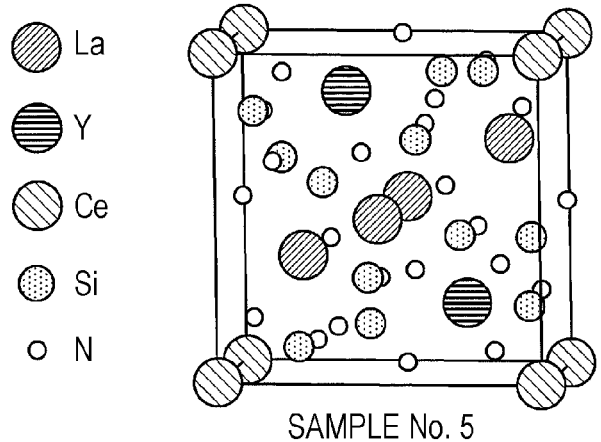
FIG. 8E is a diagram illustrating the crystal structure of $(La,Y)_3Si_6N_{11}$:Ce phosphor Sample No. 5.
Figure 8F:
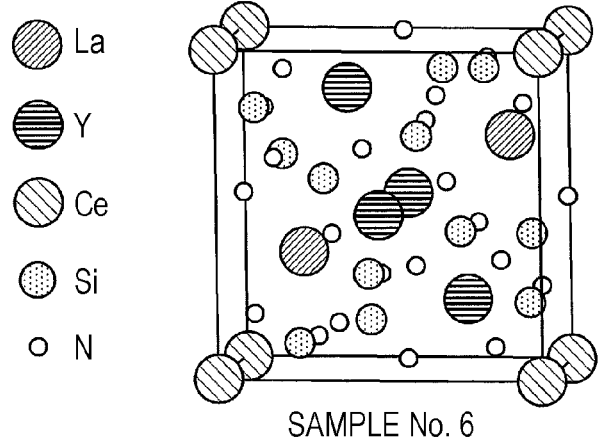
FIG. 8F is a diagram illustrating the crystal structure of $(La,Y)_3Si_6N_{11}$:Ce phosphor Sample No. 6.
Figure 8G:
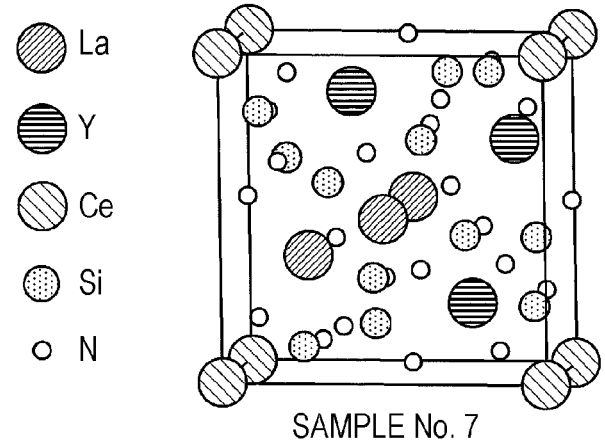
FIG. 8G is a diagram illustrating the crystal structure of $(La,Y)_3Si_6N_{11}$:Ce phosphor Sample No. 7.
Figure 8H:
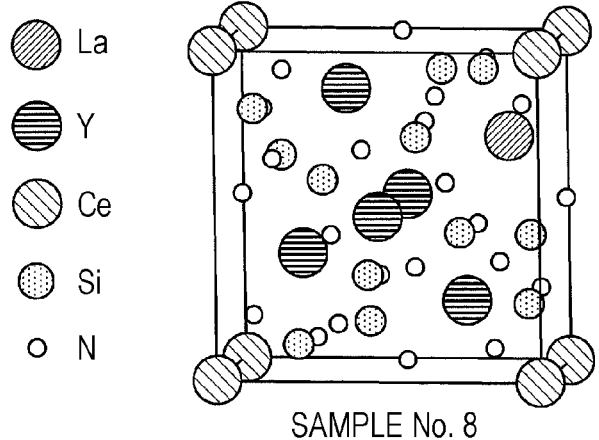
FIG. 8H is a diagram illustrating the crystal structure of $(La,Y)_3Si_6N_{11}$:Ce phosphor Sample No. 8.
Figure 8I:
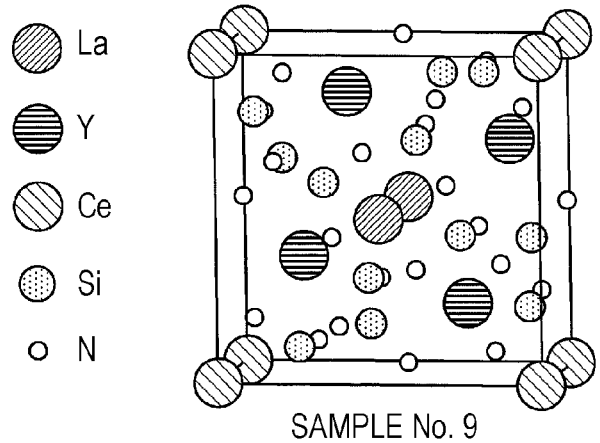
FIG. 8I is a diagram illustrating the crystal structure of $(La,Y)_3Si_6N_{11}$:Ce phosphor Sample No. 9.
Figure 8J:
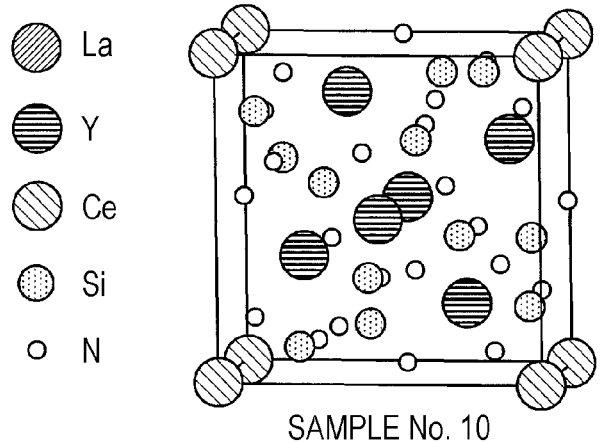
FIG. 8J is a diagram illustrating the crystal structure of $(La,Y)_3Si_6N_{11}$:Ce phosphor Sample No. 10.
Figure 9:
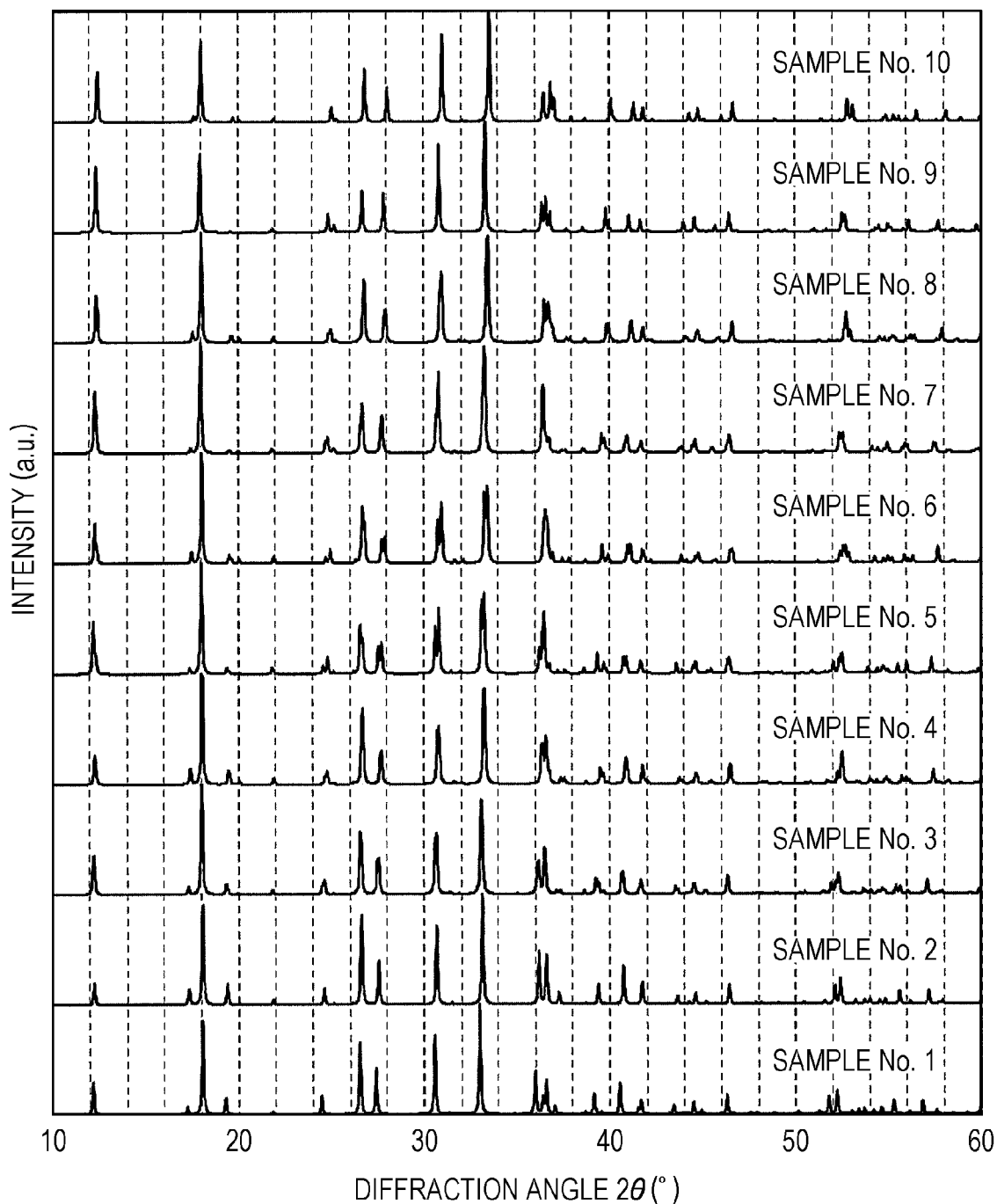
FIG. 9 is a graph showing powder XRD diffraction patterns calculated from the crystal structures of the phosphor Sample Nos. 1 to 10 shown in FIGS. 8A to 8J.

The $(La,Y)_3Si_6N_{11}$:Ce phosphor of a novel composition system was investigated by the above-mentioned calculation procedure. In the phosphor of this composition system, the $La^{3+}$-sites of $La_3Si_6N_{11}$:Ce are substituted by $Y^{3+}$. Since $Y^{3+}$ has a smaller ion radius compared to $La^{3+}$, the ligand distance of $Ce^{3+}$ in $(La,Y)_3Si_6N_{11}$ is smaller than that in $La_3Si_6N_{11}$. As a result, it can be expected to increase the emission wavelength. Table 2 shows the results of the average coordination distance $r_{ave}$ between the Ce and N, the excitation wavelength $\lambda_{ex}$, and the emission wavelength $\lambda_{em}$ calculated while changing the substitution amount of $Y^{3+}$. FIG. 4 is a graph showing a relationship between the excitation wavelength and the emission wavelength. FIG. 5 shows a relationship between the substitution amount x of $Y^{3+}$ and the lattice constant of a-axis and a relationship between the substitution amount x of $Y^{3+}$ and the lattice constant of c-axis. FIG. 6 shows a relationship between the average coordination distance $r_{ave}$ and the excitation wavelength $\lambda_{ex}$ and a relationship between the average coordination distance $r_{ave}$ and the emission wavelength $\lambda_{em}$. FIG. 7 shows the crystal structure of $La_3Si_6N_{11}$ and two different sites of La. In FIG. 7, the broken line shows the La(2a)-site, and the one dot chain line shows the La(4c)-site. FIGS. 8A to 8J show the crystal structures of phosphors of Sample Nos. 1 to 10. FIG. 9 shows powder XRD diffraction patterns calculated from the crystal structures of the phosphors of Sample Nos. 1 to 10 shown in FIGS. 8A to 8J. The symbol * shown in Table 2 means that the sample is a comparative example. In the column "Y substitution site and substitution amount" in Table 2, the Y substitution site and the Y substitution amount are written as "Y substitution site→Y substitution amount".

| Sample No. | Composition formula | Y substitution site and substitution amount | $r_{ave}$ (angstrom) | $\lambda_{ex}$ (nm) | $\lambda_{em}$ (nm) |
|---|---|---|---|---|---|
| *1 | $(La_{2.5},Ce_{0.5})Si_6N_{11}$ | — | 2.5984 | 470 | 543 |
| *2 | $(La_2,Y_{0.5},Ce_{0.5})Si_6N_{11}$ | La(2a) ← Y0.5 | 2.5976 | 467 | 549 |
| *3 | $(La_2,Y_{0.5},Ce_{0.5})Si_6N_{11}$ | La(4c) ← Y0.5 | 2.5913 | 481 | 568 |
| *4 | $(La_{1.5},Y_1,Ce_{0.5})Si_6N_{11}$ | La(2a) ← Y0.5, La(4c) ← Y0.5 | 2.5905 | 473 | 559 |
| *5 | $(La_{1.5},Y_1,Ce_{0.5})Si_6N_{11}$ | La(4c) ← Y1 | 2.5832 | 490 | 577 |
| *6 | $(La_1,Y_{1.5},Ce_{0.5})Si_6N_{11}$ | La(2a) ← Y0.5, La(4c) ← Y1 | 2.5808 | 487 | 578 |
| 7 | $(La_1,Y_{1.5},Ce_{0.5})Si_6N_{11}$ | La(4c) ← Y1.5 | 2.5774 | 498 | 605 |
| 8 | $(La_{0.5},Y_2,Ce_{0.5})Si_6N_{11}$ | La(2a) ← Y0.5, La(4c) ← Y1.5 | 2.5761 | 495 | 605 |
| 9 | $(La_{0.5},Y_2,Ce_{0.5})Si_6N_{11}$ | La(4c) ← Y2 | 2.5707 | 508 | 633 |
| 10 | $(Y_{2.5},Ce_{0.5})Si_6N_{11}$ | La(2a) ← Y0.5, La(4c) ← Y2 | 2.5698 | 507 | 636 |

Table 2 and FIG. 4 demonstrate a tendency that an increase in the substitution amount of $Y^{3+}$ increases the emission wavelength. It is also demonstrated that the excitation peak wavelength is increased with an increase in the emission wavelength. It is demonstrated that in the composition systems of Sample Nos. 7 to 10 emitting red light having an emission wavelength of 600 nm or more, the excitation wavelength peak is in a green region of 490 nm or more. As obvious from FIG. 5, it is demonstrated that the lattice constant of the a-axis decreases with an increase in the substitution amount of $Y^{3+}$, whereas the lattice constant of the c-axis increases. As also obvious from Table 2 and FIG. 6, it is demonstrated that the average coordination distance $r_{ave}$ between Ce and N decreases with an increase in the substitution amount of $Y^{3+}$, and both the emission wavelength and the excitation wavelength increase with a decrease in the value $r_{ave}$.

The emission lifetime of $Eu^{2+}$ is significantly long compared to that of $Ce^{3+}$. The emission lifetime of each of $Eu^{2+}$ and $Ce^{3+}$ correlates with the transition probability of the 4f-5d transition, and a longer emission lifetime means a lower transition probability. That is, the excitation probability of the 4f-5d transition of $Eu^{2+}$ is very low compared to the excitation probability of the 4f-5d transition of $Ce^{3+}$. However, the 5d excitation level of $Eu^{2+}$ easily overlaps the conduction band of the base material $((La,Y)_3Si_6N_{11})$. Accordingly, the energy can be efficiently absorbed between the 4f ground level of $Eu^{2+}$ and the conduction band of the base material. The absorbed energy corresponds to the energy in the blue light region. In addition, $Eu^{2+}$ has seven atoms in the 4f orbital, and the energy level of each atom has a width, resulting in a broad excitation wavelength. That is, a red phosphor containing $Eu^{2+}$ as the emission center has a broad excitation wavelength having a peak in the blue region. Accordingly, in a light source using a red phosphor containing $Eu^{2+}$ as the emission center, blue light showing the highest absorption efficiency is used as the excitation light source.

In contrast, in a phosphor containing $Ce^{3+}$ as the emission center, the 5d excitation level hardly overlaps the conduction band of the base material. Accordingly, energy absorption between the 4f ground level and the conduction band of the base material cannot be expected. Consequently, the 4f-5d transition is the main of energy absorption.

The present inventors revealed from the results of the above-described study that in the case of a red phosphor containing $Ce^{3+}$, the energy difference in the 4f-5d transition corresponds to the energy difference of the green light region. Accordingly, in a red phosphor containing $Ce^{3+}$, the absorption efficiency of the phosphor when green light is used as the excitation light source is higher than that when blue light is used as the excitation light source. Accordingly, the use of green light can increase the light output. Furthermore, the system of the present application that converts green light to red light can reduce the energy conversion loss (stokes loss), compared to a known system that converts blue light to red light, and can radiate light with higher output.

Phosphor of Embodiment 1

From the above-described results, the present inventors arrived at a novel red phosphor containing a crystal phase having a chemical composition $Ce_xY_yLa_{3-x-y}Si_6N_{11}$, where x and y satisfy $0<x\leq0.6$, and $(1.5-x)\leq y\leq(3-x)$, as a phosphor of an embodiment of the present disclosure. The phosphor of Embodiment 1 will now be described in more detail.

As described above, in the chemical composition of the phosphor of Embodiment 1, x satisfies $0<x\leq0.6$. Since the x is larger than 0, light emission by Ce can be obtained. From the viewpoint of increasing the light emission intensity, x is desirably 0.0003 or more and more desirably 0.015 or more. The maximum value of x is not particularly limited within a range allowing the phosphor to emit light. However, a too large value of x causes concentration quenching to decrease the light emission intensity. Accordingly, the decrease in the light emission intensity is prevented by adjusting x to 0.6 or less. From the viewpoint of increasing the light emission intensity, x is desirably 0.3 or less and more desirably 0.15 or less.

In the phosphor of Embodiment 1, from the viewpoint of increasing the emission wavelength and the excitation wavelength, a larger substitution amount of La by Y is preferred. Accordingly, in the chemical formula of the phosphor of this embodiment, x and y more desirably satisfy $(1.5-0.5x)\leq y\leq(3-x)$ and more desirably $1.5\leq y\leq(3-x)$.

The phosphor of Embodiment 1 has an emission spectral peak within a wavelength range of 600 nm or more and 660 nm or less. The phosphor of Embodiment 1 may have, for example, an emission spectral peak at a wavelength of 605 nm or more. The phosphor of Embodiment 1 may have, for example, an emission spectral peak at a wavelength of 640 nm or less and may have an emission spectral peak at a wavelength of 636 nm or less.

The phosphor of Embodiment 1 has an excitation spectral peak within a wavelength range of 480 nm or more and 550 nm or less. The phosphor of Embodiment 1 may have, for example, an excitation spectral peak at a wavelength of 490 nm or more or an excitation spectral peak at a wavelength of 495 nm or more. The phosphor of Embodiment 1 may have, for example, an excitation spectral peak at a wavelength of 530 nm or less or an excitation spectral peak at a wavelength of 508 nm or less.

In the phosphor of Embodiment 1, when an excitation spectral peak within a wavelength range of 480 nm or more and 550 nm or less is defined as a first excitation spectral peak, the phosphor may further have a second excitation spectral peak within a wavelength range of 350 nm or more and less than 480 nm. The first or second excitation spectral peak may be the maximum excitation spectral peak.

The crystal phase of the phosphor of Embodiment 1 may have a 1/e emission lifetime of 100 ns or less. The emission lifetime affects the brightness saturation characteristics. Known phosphors containing Eu, such as a red phosphor CASN:Eu, have long emission lifetimes, compared to phosphors containing Ce. Therefore, the phosphors containing Eu decrease the quantum efficiency under high-output excitation to easily saturate the brightness. Accordingly, the phosphor of Embodiment 1 containing Ce as the emission center is promising as a red phosphor having high quantum efficiency even under high output, compared to known red phosphors.

The crystal of the base material in the phosphor of Embodiment 1 may be a tetragon. In other words, the crystal phase having a chemical composition $Ce_xY_yLa_{3-x-y}Si_6N_{11}$ in the phosphor of Embodiment 1 may have a tetragonal crystal structure. The crystal phase may have a crystal structure that is almost the same as that of the crystal represented by the formula $La_3Si_6N_{11}$.

The crystal phase of the phosphor of Embodiment 1 may have a crystal structure where at least part of the La(2a)-sites in the crystal structure of $La_3Si_6N_{11}$ are substituted by Ce. The crystal phase of the phosphor of Embodiment 1 may have a crystal structure where at least part of the La(4c)-sites in the crystal structure of $La_3Si_6N_{11}$ are substituted by Y or may have a crystal structure where more than a half of the La(4c)-sites in the crystal structure of $La_3Si_6N_{11}$ are substituted by Y.

La in the crystal structure of $La_3Si_6N_{11}$ has two coordination states, an La(2a)-site and an La(4c)-site, as shown in FIG. 7. The La(2a)-site has high symmetry, and the La(4c)-site has low symmetry. For example, when La of the La(2a)-site having high symmetry is substituted by Ce having a large ion radius, the formation enthalpy determined by first-principle calculation is low such as about 48 meV, the crystal structure is thermodynamically stable. From this viewpoint, it is desirable that the crystal phase of the phosphor of Embodiment 1 have a crystal structure where at least part of the La(2a)-sites in the crystal structure of $La_3Si_6N_{11}$ are substituted by Ce. In addition, for example, when La of the La(4c)-site having low symmetry is substituted by Y, the lattice distortion is large, leading to an increase in the splitting of the 5d orbital of Ce. Accordingly, since the energy difference between the 4f and 5d orbitals is decreased, the excitation wavelength and the emission wavelength can be shifted to the longer wavelength side. From this viewpoint, it is desirable that the crystal phase of the phosphor of Embodiment 1 have a crystal structure where at least part of the La(4c)-sites in the crystal structure of $La_3Si_6N_{11}$ are substituted by Y. Furthermore, it is desirable that the crystal phase have a crystal structure where more than a half of the La(4c)-sites in the crystal structure of $La_3Si_6N_{11}$ are substituted by Y.

Method of Producing Phosphor

A method of producing the phosphor of Embodiment 1 will now be described.

As raw materials, for example, compounds respectively containing Ce, La, Si, and Y may be used. Alternatively, each of Ce, La, Si, and Y may be used as a simple substance. As the compounds, for example, compounds becoming nitrides by firing under a nitrogen atmosphere, high-purity (purity: 99% or more) nitrides, and metal alloys can be used. In order to accelerate the reaction, a small amount of a fluoride (such as ammonium fluoride) may be added.

For example, a Ce compound, a La compound, a Si compound, and a Y compound may be prepared to give a chemical composition ratio represented by $Ce_xY_yLa_{3-x-y}Si_6N_{11}$ ($0<x\leq0.6$, $(1.5-x)\leq y\leq(3-x)$), where the Si compound may be replaced by a Si simple substance. Specifically, as the raw material, for example, a $CeF_3$ powder, a LaN powder, a $Si_3N_4$ powder, and a YN powder may be used, where the $CeF_3$ powder may be replaced by a CeN powder, the $Si_3N_4$ powder may be replaced by a Si simple substance, and the LaN powder may be prepared in an amount higher by about 24% than the theoretical value, since LaN is easily decomposed during firing, generation of a by-product $LaSi_3N_5$ crystal can be suppressed by charging an excessive amount of LaN in blending of the raw materials.

The phosphor of Embodiment 1 is produced by mixing the above-mentioned raw materials and firing the mixture. The method of mixing the raw materials may be wet blending in a solution or dry blending of dry powders. A machine commonly used industrially, such as a ball mill, a medium stirring mill, a planetary mill, a vibration mill, a jet mill, a V-type mixer, and a stirrer, can be used. The firing is performed in an atmosphere pressurized with nitrogen within a temperature range of 1500° C. to 2000° C. for about 1 to 50 hours. The pressure in this case is usually 3 atm or more, desirably 4 atm or more, and more desirably 8 atm or more. The phosphor after firing may be washed, for example, in a 10% nitric acid solution for 1 hour. The resulting phosphor powder may be pulverized again with, for example, a ball mill or a jet mill and may be further washed or sorted as needed to adjust the particle size distribution and fluidity of the phosphor powder.

Light-Emitting Apparatus Using Phosphor

The phosphor of Embodiment 1 can be used in light-emitting apparatuses. The light-emitting apparatus in this embodiment at least includes an excitation light source and a first phosphor. The excitation light source emits light of a wavelength of 600 nm or less. The first phosphor is irradiated with light emitted from the excitation light source and emits fluorescence having a wavelength longer than that of the light emitted from the excitation light source. The first phosphor is, for example, any of the phosphors described in Embodiment 1. The structure as described above can construct a light-emitting apparatus showing high quantum efficiency even under high output.

The light emitted from the excitation light source may have a wavelength of 480 nm or more and 600 nm or less. The phosphor of Embodiment 1 typically has an excitation spectral peak within a wavelength range of 480 nm or more and 550 nm or less and therefore can be efficiently excited by using an excitation light source emitting light within the above-mentioned wavelength range. The light emitted from the excitation light source may contain light of a wavelength of 200 nm or more and 480 nm or less or may contain light of a wavelength of 420 nm or more and 480 nm or less. The phosphor of Embodiment 1 can also absorb excitation light of a wavelength of 480 nm or less. However, since light having a wavelength of 200 nm or less attenuates by absorption by air, the excitation light source desirably emits light of a wavelength of 200 nm or more. Examples of the excitation light source include LEDs and LDs.

The light-emitting apparatus of the embodiment may further include a second phosphor having an emission spectral peak within a wavelength range of 500 nm or more and 600 nm or less. That is, the light-emitting apparatus may include a combination of a first phosphor and a second phosphor. The second phosphor is irradiated with light emitted from the excitation light source and thereby emits fluorescence having a wavelength longer than that of the light emitted from the excitation light source. The second phosphor may be, for example, a phosphor containing a crystal phase having a chemical composition $Y_3Al_5O_{12}$:Ce (YAG:Ce) or a phosphor containing a crystal phase having a chemical composition $La_3Si_6N_{11}$:Ce(LSN:Ce).

Alternatively, the second phosphor may be, for example, a phosphor emitting yellow light. The light-emitting apparatus may further include a third phosphor emitting green light. That is, the light-emitting apparatus may include a combination of a first phosphor, a second phosphor emitting yellow light, and a third phosphor emitting green light. The third phosphor is irradiated with light emitted from the excitation light source and thereby emits fluorescence having a wavelength longer than that of the light emitted from the excitation light source. The third phosphor may be, for example, a phosphor containing a crystal phase having a chemical composition $Lu_3Al_5O_{12}$:Ce(LuAG:Ce) or a phosphor containing a crystal phase having a crystal composition $Y_3(Al,Ga)_5N_{12}$:Ce(YAGG:Ce). Furthermore, the phosphor of Embodiment 1 may be excited by the light emitted by the second phosphor and/or the third phosphor. Herein, the green light refers to light located, in the CIE chromaticity coordinate value, within a range of $0.1 \leq x \leq 0.4$ and $0.5 \leq y \leq 0.8$. The yellow light refers to light located, in the CIE chromaticity coordinate value, within a range of $0.4 \leq x \leq 0.6$, and $0.4 \leq y \leq 0.6$.

The excitation light source and the second and third phosphors in the light-emitting apparatus including the phosphor of Embodiment 1 can be freely selected within the above-described ranges according to the purpose of the light-emitting apparatus. Accordingly, the light-emitting apparatus including the phosphor of Embodiment 1 is useful as not only a red light-emitting apparatus but also, for example, a white light-emitting apparatus. Specifically, a high-output light-emitting apparatus having high color rendering properties or a high-output light-emitting apparatus emitting light of light bulb color can be achieved by combining an excitation light source emitting blue light, a phosphor emitting yellow light, and the red phosphor of the embodiment.

Embodiment 2

Figure 10:
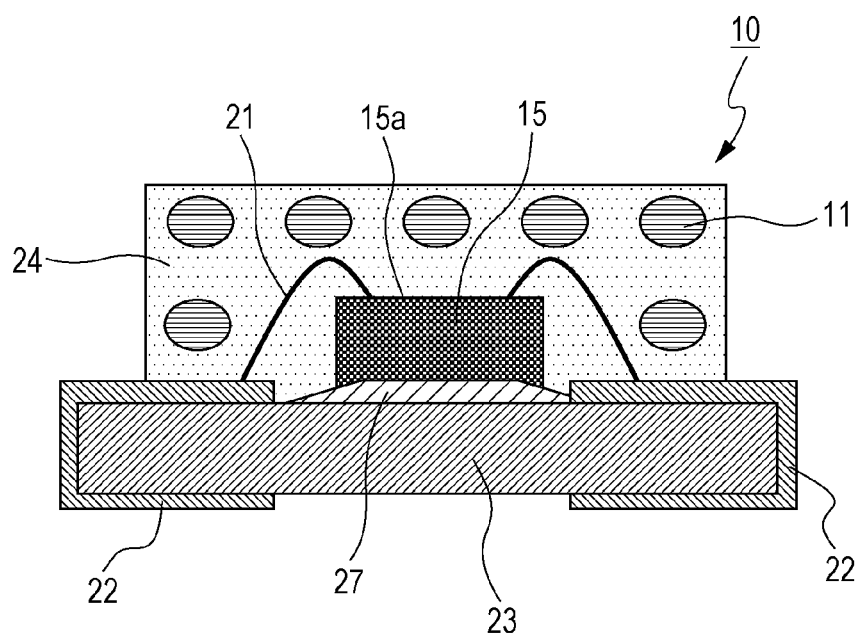
FIG. 10 is a schematic cross-sectional view of an LED light-emitting apparatus according to Embodiment 2.

In Embodiment 2, an LED light-emitting apparatus including an LED chip of a light emitting element as the light source will be described as an example of the light-emitting apparatus of the present disclosure. FIG. 10 is a schematic cross-sectional view illustrating an embodiment of the LED light-emitting apparatus according to Embodiment 2. As shown in FIG. 10, the LED light-emitting apparatus 10 includes a phosphor 11, an LED chip 15, and an LED sealing member 24 and may further include a support 23. The support 23 supports the LED chip 15. In this embodiment, the LED light-emitting apparatus 10 has a surface-mountable structure, and the support 23 is therefore a substrate.

The embodiment can be used in a high-brightness LED light-emitting apparatus. For example, the support 23 has high thermal conductivity such that the heat generated in the LED chip 15 can be efficiently released to the outside. For example, a ceramic substance made of alumina, aluminum nitride, or the like can be used as the support 23.

The LED chip 15 is, for example, a chip emitting light in the ultraviolet to yellow region and having an emission spectral peak within a wavelength range of 200 nm or more and 600 nm or less. Specifically, the LED chip 15 is, for example, a yellow LED chip, a green LED chip, a blue LED chip, a violet LED chip, a near ultraviolet LED chip, or an ultraviolet LED chip. On the support 23, the LED chip 15 is fixed to the support 23 with, for example, solder 27 in such a manner that the light emission surface 15a is not the surface in contact with the support 23. In addition, the LED chip 15 is electrically connected to electrodes 22 provided to the support 23 via bonding wires 21. The LED chip 15 is covered with an LED sealing member 24.

The LED sealing member 24 is, for example, a silicone resin. The phosphor 11 is dispersed in the LED sealing member 24. As the silicone resin, silicone resins having structures defined by various chemical formulae used as sealing resins for semiconductor light emitting elements can be used. The silicone resin contains, for example, dimethyl silicone having high color fastness. In addition, for example, methylphenyl silicone having high heat resistance can be used as the silicone resin. The silicone resin may be a homopolymer defined by one chemical formula and including a main skeleton having a siloxane bond or may be a copolymer including structural units defined by two or more chemical formulae and having siloxane bonds or an alloy of two or more silicone polymers.

In this embodiment, the silicone resin in the LED sealing member 24 is in a cured state. Accordingly, the LED sealing member 24 is also in a cured state. As described below, the LED sealing member 24 can be produced using an uncured silicone resin. The silicone resin is usually a two-pack type resin of which curing is enhanced by mixing a main agent and a curing agent. However, a thermosetting silicone resin or an energy setting silicone resin, which cures by being irradiated with energy, such as light, can also be used. Furthermore, a material other than the silicone resin may be used in the LED sealing member 24. For example, glass, an epoxy resin, and an inorganic material composed of ZnO may be used. The phosphor 11 may be disposed in a form of a phosphor plate on the LED sealing member 24, without being dispersed in the LED sealing member 24.

In the examples described above, the LED chip is wire-bonded. The LED chip used in the embodiment may have another structure. That is, the LED chip used in the embodiment may be face-up mounted or may be flip-chip mounted. The LED chip used in the embodiment may include a light emission layer formed of a nitride semiconductor having a growing surface of a typical polar surface (c face).

Overview of Phosphor

The phosphor 11 absorbs part or the whole of the wavelength components of light (e.g., near ultraviolet light) in the near ultraviolet to yellow region emitted from the LED chip 15 and emits fluorescence. The wavelength of the light to be absorbed and the wavelength of the fluorescence are determined depending on the type of the fluorescent material contained in the phosphor 11. The phosphor 11 may be a phosphor mixture containing a plurality of phosphors of different colors so as to produce white light by color mixing of light. The phosphor 11 may be a phosphor mixture of a green phosphor and a red phosphor. The red phosphor is the phosphor of Embodiment 1.

The green phosphor is, for example, $M''_2MgSi_2O_7$:$Eu^{2+}$ ($M''$: at least one selected from Ba, Sr, and Ca), $SrSi_5AlO_2N_7$:$Eu^{2+}$, $SrSi_2O_2N_2$:$Eu^{2+}$, $BaAl_2O_4$:$Eu^{2+}$, $BaZrSi_3O_9$:$Eu^{2+}$, $M''_2SiO_4$:$Eu^{2+}$ ($M''$: at least one selected from Ba, Sr, and Ca), $BaSi_3O_4N_2$:$Eu^{2+}$, $Ca_8Mg(SiO_4)_4Cl_2$:$Eu^{2+}$, $Ca_3SiO_4Cl_2$:$Eu^{2+}$, or β-SiAlON:$Eu^{2+}$.

In another aspect, the phosphor 11 may be a phosphor mixture of a yellow phosphor and a red phosphor. The red phosphor is the phosphor of Embodiment 1. The yellow phosphor is, for example, $Y_3Al_5O_{12}:Ce^{3+}$, $CaSi_2O_2N_2:Eu^{2+}$, $(Ba,Sr)Si_2O_2N_2:Eu^{2+}$, $Ca_3Sc_2Si_3O_{12}:Ce^{3+}$, $CaSc_2O_4:Ce^{3+}$, $\alpha\text{-SiAlON}:Eu^{2+}$, or $La_3Si_6N_{11}:Ce^{3+}$.

The particle diameter of the phosphor 11 is, for example, 1 μm or more and 80 μm or less. Throughout the specification, the particle diameter is represented by the circle equivalent diameter by a microscopic method.

The phosphor 11 is contained in the LED sealing member 24 at a rate of, for example, 3 parts by weight or more and 70 parts by weight or less based on 100 parts by weight of the sealing member. If the content of the phosphor 11 is less than 3 parts by weight, fluorescence with sufficient intensity cannot be obtained, which may make the LED light-emitting apparatus 10 impossible to emit light of a desired wavelength. The weight ratio of the phosphors that emit light of the respective colors used as the phosphor 11 can be appropriately determined according to the desired tone of white light and the light emission intensity of each phosphor. The LED light-emitting apparatus can also be constructed so as to emit light of a color other than white by using, as the phosphor 11, the red phosphor of Embodiment 1 alone or in combination with a phosphor of another color.

The phosphor other than the red phosphor of Embodiment 1 can be produced in accordance with a known method. Specifically, an oxide phosphor is produced using a compound becoming an oxide by firing, such as a hydroxide, an oxalate, or nitrate, or an oxide as a raw material. Herein, in order to accelerate the reaction, a small amount of a fluoride (e.g., calcium fluoride) or a chloride (e.g., calcium chloride) can be added. The phosphor is produced by mixing the above-mentioned raw materials and firing the mixture.

The method of mixing the raw materials may be wet blending in a solvent or dry blending of dry powders. A machine commonly used industrially, such as a ball mill, a medium stirring mill, a planetary mill, a vibration mill, a jet mill, a V-type mixer, or a stirrer, can be used. The phosphor raw materials are fired in the atmosphere or under a reducing atmosphere within a temperature range of 1100° C. to 1700° C. for about 1 to 50 hours. A furnace that is usually used industrially can be used for the firing. For example, a continuous furnace, such as a pusher furnace; a batch type electric or gas furnace; or a pressure firing furnace for spark plasma sintering (SPS) or hot isostatic pressing (HIP) sintering can be used. The resulting phosphor powder is pulverized again with, for example, a ball mill or a jet mill and is further optionally washed or sorted to adjust the particle size distribution and fluidity of the phosphor powder.

Embodiment 3

Figure 11:
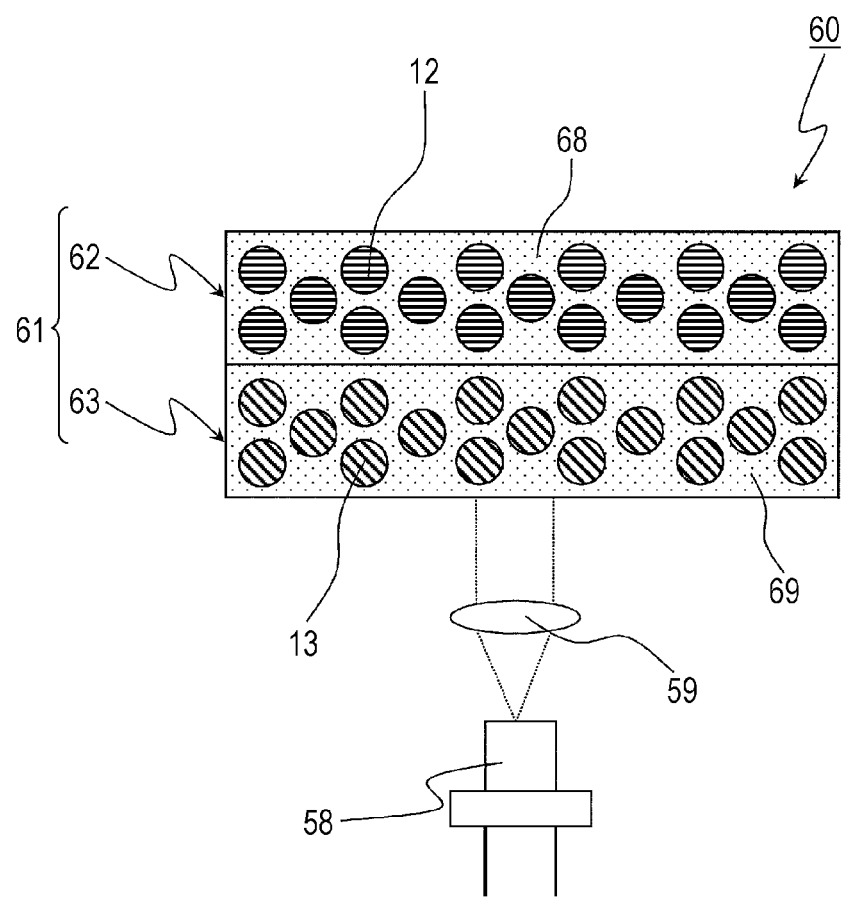
FIG. 11 is a schematic cross-sectional view of an LD light-emitting apparatus according to Embodiment 3.

In Embodiment 3, an LD light-emitting apparatus including an LD of a light emitting element as the light source will be described as an example of the light-emitting apparatus of the present disclosure. FIG. 11 illustrates a schematic structure of the LD light-emitting apparatus 60 according to Embodiment 3. The LD light-emitting apparatus 60 includes an LD element 58 and a wavelength conversion member 61. The wavelength conversion member 61 contains a phosphor. The phosphor converts the light emitted from the LD element 58 to light having a longer wavelength.

The LD element 58 can emit light with a high light power density compared to an LED. Accordingly, the use of the LD element 58 allows to construct a higher-output LD light-emitting apparatus 60. The power density of the light emitted from the LD element 58 and irradiating the phosphor is, for example, 0.5 W/mm² or more from the viewpoint of increasing the output of the LD light-emitting apparatus 60. The power intensity of the light irradiating the phosphor may be 2 W/mm² or more, 3 W/mm² or more, or 10 W/mm² or more. However, a too high power density of the light irradiating the phosphor increases the amount of heat generated by the phosphor and has a risk of adversely affecting the LD light-emitting apparatus 60. Accordingly, the power density of the light irradiating the phosphor may be 150 W/mm² or less, 100 W/mm² or less, 50 W/mm² or less, or 20 W/mm² or less.

The LD element 58 may be any LD element that emits light of a wavelength capable of exciting the phosphor. For example, an LD element emitting violet light, an LD element emitting blue light, an LD element emitting green light, or an LD element emitting yellow light can be used. In this embodiment, an LD element 58 emitting blue light will be described. Throughout the specification, the term "blue light" refers to light having a peak wavelength of 420 nm or more and less than 480 nm. In general, the LD element 58 emitting blue light has high light emission efficiency, compared to an LD element emitting ultraviolet light, and exhibits the highest light emission efficiency when the emission peak wavelength is 445 nm. The light emission peak wavelength of the LD element 58 may be 425 nm or more or 430 nm or more. At the same time, the light emission peak wavelength of the LD element 58 may be 475 nm or less or 470 nm or less.

The LD element 58 may be composed of a single LD or may be composed of a plurality of optically connected LDs. The LD element 58 may include, for example, a light emission layer formed from a nitride semiconductor having a growing surface that is a non-polar or semi-polar surface.

The phosphor of the wavelength conversion member 61 includes the red phosphor of Embodiment 1. The wavelength conversion member 61 may further include a phosphor other than the red phosphor of Embodiment 1 according to the desired color of the light emitted from the light-emitting apparatus. For example, when the wavelength conversion member 61 further includes a yellow phosphor and a green phosphor, the LD light-emitting apparatus 60 can be constructed as a white light-emitting apparatus. As the yellow phosphor and the green phosphor, the examples mentioned in Embodiment 2 can be used. The wavelength conversion member 61 may be composed of a single wavelength conversion layer in which a plurality of phosphors are mixed or may be composed of laminated two or more wavelength conversion layers each containing one or more phosphors. In this embodiment, a case of using a wavelength conversion member 61 having a laminated structure composed of a first phosphor layer 62 constituted of a red phosphor 12 and a second phosphor layer 63 constituted of a yellow phosphor 13 will be specifically described.

The first phosphor layer 62 and the second phosphor layer 63 are constituted by using binders 68 and 69, respectively. The binders 68 and 69 are each, for example, a resin, glass, or a medium, such as a transparent crystal. The binders 68 and 69 may be the same material or different materials. Each of the phosphor layers may be constituted of phosphor particles only.

Between the wavelength conversion member 61 and the LD element 58, an incident optical system 59 guiding the light of the LD element 58 to the second phosphor layer 63 may be disposed. The incident optical system 59 may include, for example, a lens, mirror, or an optical fiber.

Subsequently, operation of the LD light-emitting apparatus 60 will be described. Blue light emitted from the LD element 58 passes through the incident optical system 59 and enters the second phosphor layer 63 of the wavelength conversion member 61. This incident light excites a plurality of molecules of the yellow phosphor 13 in the second phosphor layer 63, and yellow light is emitted. The blue light emitted from the LD element 58 and passed through the second phosphor layer 63 without being absorbed enters the first phosphor layer 62. This incidence excites a plurality of molecules of the red phosphor 12 in the first phosphor layer 62, and red light is emitted. In addition, the yellow light radiated from the second phosphor layer 63 enters the first phosphor layer 62. Part of this incident light may excite a plurality of molecules of the red phosphor 12 in the first phosphor layer 62, and red light may be emitted. The blue light emitted from the LD element 58 and passed through the first phosphor layer 62 and second phosphor layer 63 without being absorbed is radiated to the outside. These red light, yellow light, and blue light are mixed into white light.

The thickness of each of the phosphor layers may be adjusted such that the blue light emitted from the LD element 58 does not pass through the first phosphor layer 62 and that the yellow light radiated from the second phosphor layer 63 does not pass through the first phosphor layer 62. In this case, only the red light is radiated to the outside. In another aspect, the yellow phosphor 13 used in the second phosphor layer 63 may be replaced by the green phosphor described in Embodiment 2.

Embodiment 4

Figure 12:
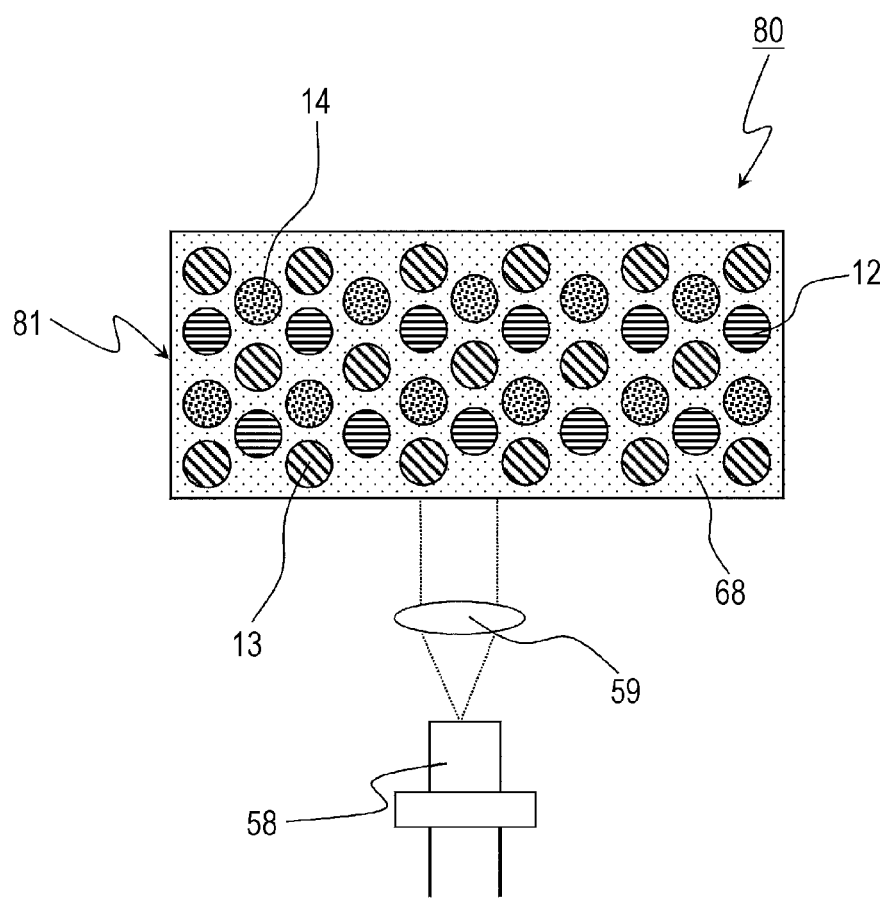
FIG. 12 is a schematic cross-sectional view of an LD light-emitting apparatus according to Embodiment 4.

In Embodiment 4, an LD light-emitting apparatus including an LD of a light emitting element as the light source will be described as an example of the light-emitting apparatus of the present disclosure. FIG. 12 illustrates a schematic structure of the LD light-emitting apparatus 80 according to Embodiment 4. The same members as in Embodiment 3 are assigned with the same reference signs, and the descriptions thereof are omitted. The LD light-emitting apparatus 80 includes an LD element 58 and a wavelength conversion member 81.

The wavelength conversion member 81 contains a phosphor. The phosphor converts the light emitted from the LD element 58 to light having a longer wavelength. The wavelength conversion member 81 includes a wavelength conversion layer in which a red phosphor 12 and at least one phosphor selected from the group consisting of a yellow phosphor 13 and a green phosphor 14 are mixed. The red phosphor 12 is the phosphor of Embodiment 1. As the yellow phosphor and the green phosphor, the examples mentioned in Embodiment 2 can be used. In this embodiment, a case where the wavelength conversion member 81 is a phosphor layer formed by mixing three phosphors, a red phosphor 12, a yellow phosphor 13, and a green phosphor 14, will be specifically described. The mixing ratio of the three phosphors can be appropriately adjusted according to the desired tone of white light and the light emission intensity of each phosphor.

The phosphor layer as the wavelength conversion member 81 is constituted by using a binder 68. The binder 68 is, for example, a resin, glass, or a medium, such as a transparent crystal. The binder 68 may be composed of a single material or may be composed of materials different depending on positions. The phosphor layer may be constituted of phosphor particles only.

The blue light emitted from the LD element 58 passes through an incident optical system 59 and is converted by the red phosphor 12, the yellow phosphor 13, and the green phosphor 14 in the wavelength conversion member 81 to red light, yellow light, and green light, respectively. The blue light emitted from the LD element 58 and not absorbed by the phosphors and the red light, the yellow light, and the green light converted by the red phosphor 12, the yellow phosphor 13, and the green phosphor 14, respectively, are mixed into white light. The red phosphor 12 is excited by incidence of part of the green light emitted from the green phosphor 14 and emits red light.

As described above, in the light-emitting apparatuses of Embodiment 2 to 4, since the red phosphor of Embodiment 1 is used, the quantum efficiency under high output can be improved than before. Furthermore, when these light-emitting apparatuses are constructed as white light-emitting apparatuses, high color rendering properties and color reproducibility can be achieved.

Embodiment 5

Figure 13:
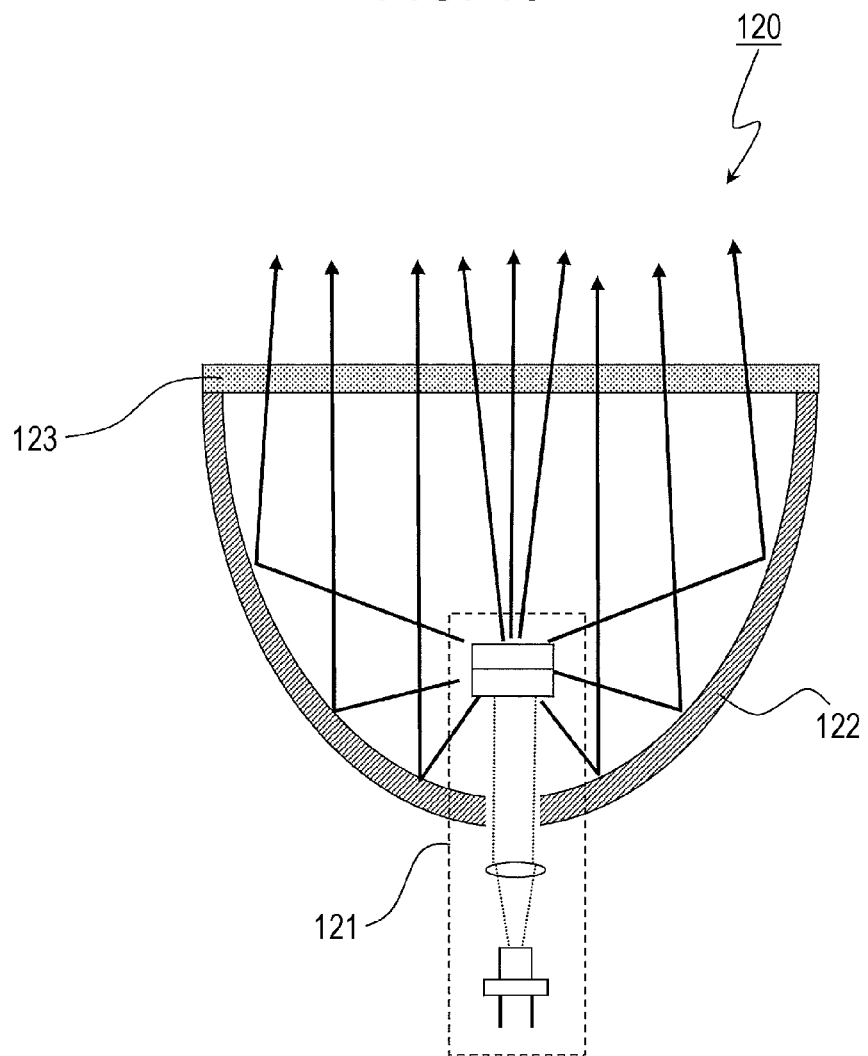
FIG. 13 is a schematic cross-sectional view of a lighting system according to Embodiment 5.

In Embodiment 5, an example of a lighting system of the present disclosure will be described. FIG. 13 illustrates a schematic structure of a lighting system 120 according to Embodiment 5. The lighting system 120 includes a light source 121 and a light-emitting optical system 122 guiding the light emitted by the light source 121 forward. In order to adjust the color of light from the light source, a wavelength cut filter 123 absorbing or reflecting the light from the light source may be provided. The light source 121 includes the red phosphor of Embodiment 1. Alternatively, the light source 121 may be the light-emitting apparatus 10, 60, or 80 of Embodiments 2 to 4. The light-emitting optical system 122 may be, for example, a reflector. The light-emitting optical system 122 may include, for example, a film of a metal, such as Al or Ag, or an Al film having a protective film formed on a surface.

In the lighting system of Embodiment 5, since the red phosphor of Embodiment 1 is used, the quantum efficiency under high output can be improved compared to known lighting systems. Furthermore, when the lighting system is constructed as a white lighting system, high color rendering properties and color reproducibility can be achieved.

Embodiment 6

Figure 14:
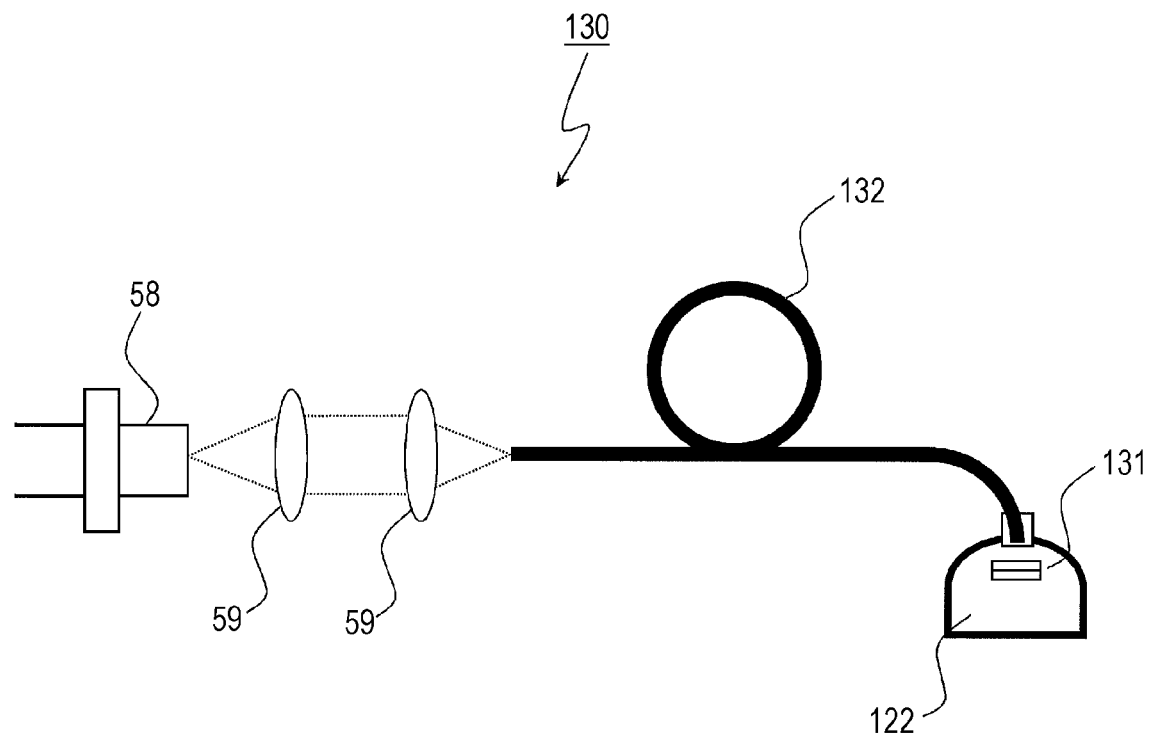
FIG. 14 is a schematic cross-sectional view of a lighting system according to Embodiment 6.

In Embodiment 6, a lighting system using an optical fiber will be described as an example of the lighting system of the present disclosure. FIG. 14 illustrates a schematic structure of the lighting system 130 according to Embodiment 6. The lighting system 130 includes an LD element 58, incident optical systems 59, an optical fiber 132, a wavelength conversion member 131, and a light-emitting optical system 122.

The light emitted from the LD element 58 passes through the incident optical systems 59 and is guided to the optical fiber 132. The optical fiber 132 guides the light to an emission part. The emission part includes, for example, the wavelength conversion member 131 and the light-emitting optical system 122. The wavelength conversion member 131 includes the red phosphor of Embodiment 1. The wavelength conversion member 131 may be the wavelength conversion member 61 or 81 of Embodiments 3 and 4. Although the wavelength conversion member 131 may be disposed on the emission side than the optical fiber 132 as shown in FIG. 14, it may be disposed on the incidence side (e.g., between the LD element 58 and the incident optical system 59 or between the incident optical system 59 and the optical fiber 132) than the optical fiber 132.

In the lighting system of Embodiment 6, the direction of light irradiation can be easily changed by using the optical fiber.

Since the red phosphor of Embodiment 1 is used, the quantum efficiency under high output can be improved compared to known lighting systems. Furthermore, when the lighting system is constructed as a white lighting system, high color rendering properties and color reproducibility can be achieved.

Embodiment 7

Figure 15:
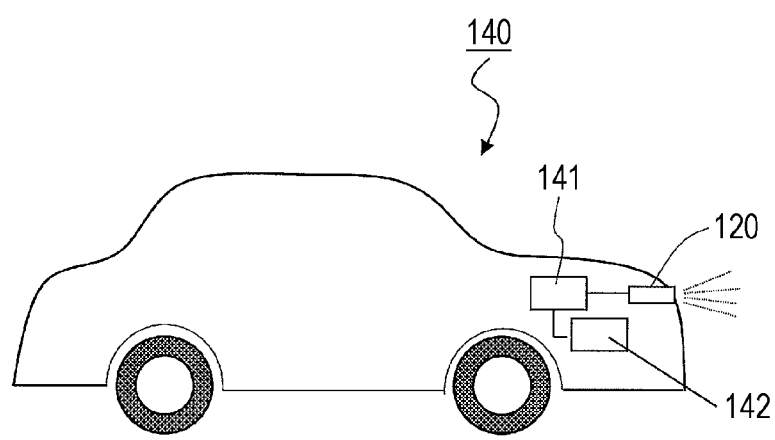
FIG. 15 is a schematic cross-sectional view of a vehicle according to Embodiment 7.

In Embodiment 7, a vehicle including a lighting system will be described as an application example of the lighting system of the present disclosure. FIG. 15 illustrates a schematic structure of the vehicle 140 according to Embodiment 7. The vehicle 140 includes a head lamp for the vehicle of the lighting system 120 of Embodiment 5 and a power supply source 141. The vehicle 140 may be rotationally driven by a driving force, such as an engine, and may include a power generator 142 that generates power. The power generated by the power generator 142 may be stored in the power supply source 141. The power supply source 141 may be a rechargeable secondary battery. The lighting system 120 is turned on by the power from the power supply source 141. The vehicle 140 is, for example, a car, a motorcycle, or a special vehicle. In addition, the vehicle 140 may be an engine car, an electric car, or a hybrid car.

In the vehicle of Embodiment 7, since the red phosphor of Embodiment 1 is included in the head lamp for the vehicle, the lamp can light forward brightly more than before under high output. Furthermore, when the lamp is constructed as a white lighting system, high color rendering properties and color reproducibility can be achieved.

The phosphor of the present disclosure is useful as, for example, a light-emitting apparatus. The phosphor of the resent disclosure can be used as a light source of, for example, a general lighting system, such as a ceiling light; a special lighting system, such as a spotlight, stadium lighting, and studio lighting; a vehicle lighting system, such as a head lamp; a projection apparatus, such as a projector and a head-up display; an image pickup apparatus, such as an endoscopic light, a digital camera, a mobile phone, and a smartphone; and a liquid crystal display, such as a monitor for a personal computer (PC), notebook personal computer, television, portable digital assistant (PDX), smartphone, tablet PC, or mobile phone.

What is claimed is:

1. A phosphor comprising a crystal phase having a chemical composition $Ce_xY_yLa_{3-x-y}Si_6N_{11}$, where x and y satisfy $0<x\leq0.6$, and $(1.5-x)\leq y\leq(3-x)$, and the phosphor having:
an emission spectral peak within a wavelength range of 600 nm or more and 660 nm or less; and
a first excitation spectral peak within a wavelength range of 480 nm or more and 550 nm or less.

2. The phosphor according to claim 1, wherein x and y satisfy $(1.5-0.5x)\leq y\leq(3-x)$.

3. The phosphor according to claim 1, wherein x and y satisfy $1.5\leq y\leq(3-x)$.

4. The phosphor according to claim 1, wherein the crystal phase has a tetragonal crystal structure.

5. The phosphor according to claim 1, having:
a second excitation spectral peak within a wavelength range of 350 nm or more and less than 480 nm.

6. The phosphor according to claim 1, wherein the crystal phase has a 1/e emission lifetime of 100 ns or less.

7. The phosphor according to claim 1, wherein the crystal phase has a crystal structure where at least part of La(2a)-sites in the crystal structure of $La_3Si_6N_{11}$ are substituted by Ce.

8. The phosphor according to claim 1, wherein the crystal phase has a crystal structure where at least part of La(4c)-sites in the crystal structure of $La_3Si_6N_{11}$ are substituted by Y.

9. The phosphor according to claim 8, wherein the crystal phase has a crystal structure where more than a half of the La(4c)-sites in the crystal structure of $La_3Si_6N_{11}$ are substituted by Y.

10. A light-emitting apparatus comprising:
an excitation light source that emits light having a wavelength of 600 nm or less; and
a first phosphor that is disposed at a location where the first phosphor is irradiated with the light emitted by the excitation light source, so as to emit fluorescence having a wavelength longer than the wavelength of the light from the excitation light source, wherein
the first phosphor comprises a crystal phase having a chemical composition $Ce_xY_yLa_{3-x-y}Si_6N_{11}$, where x and y satisfy $0<x\leq0.6$, and $(1.5-x)\leq y\leq(3-x)$, and
the phosphor has:
an emission spectral peak within a wavelength range of 600 nm or more and 660 nm or less; and
a first excitation spectral peak within a wavelength range of 480 nm or more and 550 nm or less.

11. The light-emitting apparatus according to claim 10, wherein
the wavelength of the light emitted by the excitation light source is within a wavelength range of 480 nm or more and 600 nm or less.

12. The light-emitting apparatus according to claim 10, wherein
the wavelength of the light emitted by the excitation light source is within a wavelength range of 420 nm or more and 480 nm or less.

13. The light-emitting apparatus according to claim 10, wherein
the excitation light source is an LED or an LD.

14. The light-emitting apparatus according to claim 10, further comprising:
a second phosphor that is disposed at a location where the second phosphor is irradiated with the light emitted by the excitation light source, so as to emit fluorescence having a wavelength longer than the wavelength of the light from the excitation light source, wherein
the second phosphor has an emission spectral peak within a wavelength range of 480 nm or more and less than 600 nm.

15. The light-emitting apparatus according to claim 14, further comprising:
a third phosphor that is disposed at a location where the third phosphor is irradiated with the light emitted by the excitation light source, so as to emit fluorescence having a wavelength longer than the wavelength of the light from the excitation light source, wherein
the second phosphor emits yellow light; and
the third phosphor emits green light.

* * * * *